(12) United States Patent
Lee et al.

(10) Patent No.: US 12,148,378 B2
(45) Date of Patent: Nov. 19, 2024

(54) STRETCHABLE DISPLAY DEVICE

(71) Applicant: LG Display Co., Ltd., Seoul (KR)

(72) Inventors: Booheung Lee, Paju-si (KR); Yongmin Jeong, Paju-si (KR); DongHo Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/982,296

(22) Filed: Nov. 7, 2022

(65) Prior Publication Data
US 2023/0206843 A1 Jun. 29, 2023

(30) Foreign Application Priority Data
Dec. 29, 2021 (KR) .......................... 10-2021-0190926

(51) Int. Cl.
*G09G 3/3233* (2016.01)
*G09G 3/00* (2006.01)
*G09G 3/32* (2016.01)
*H10K 59/121* (2023.01)

(52) U.S. Cl.
CPC ........... *G09G 3/3233* (2013.01); *G09G 3/035* (2020.08); *G09G 3/32* (2013.01); *G09G 2300/0426* (2013.01); *H10K 59/1213* (2023.02)

(58) Field of Classification Search
CPC ........ G09G 3/3233; G09G 3/035; G09G 3/32; G09G 2300/0426; G09G 3/006; G09G 3/325; H10K 59/1213; H10K 59/126; H10K 77/111; H10K 59/124; H10K 59/19; H10K 59/80; H10K 59/122; H10K 59/121; H10K 59/131; H10K 59/38; H10K 59/65; H01L 25/10; H01L 25/167; H01L 24/32; H01L 25/162; H01L 27/1218; G06F 1/189; G09F 9/301; H05K 1/0283

See application file for complete search history.

(56) References Cited

U.S. PATENT DOCUMENTS

| | | | | |
|---|---|---|---|---|
| 2020/0144522 A1* | 5/2020 | Jung | ..................... | H10K 77/111 |
| 2020/0152132 A1* | 5/2020 | Kim | ..................... | H10K 59/126 |
| 2020/0203312 A1* | 6/2020 | Yun | ..................... | H10K 77/111 |
| 2020/0212117 A1* | 7/2020 | Jeon | ..................... | H01L 27/1218 |
| 2020/0409419 A1* | 12/2020 | He | ..................... | G06F 1/189 |
| 2021/0027671 A1* | 1/2021 | Lee | ..................... | H10K 77/111 |
| 2021/0028155 A1* | 1/2021 | Kim | ..................... | H05K 1/0283 |
| 2021/0056873 A1* | 2/2021 | Jung | ..................... | H10K 59/122 |

(Continued)

FOREIGN PATENT DOCUMENTS

| | | | |
|---|---|---|---|
| KR | 20200053969 A | | 5/2020 |
| KR | 20210052723 A | | 5/2021 |

*Primary Examiner* — Richard J Hong
(74) *Attorney, Agent, or Firm* — Seed IP Law Group LLP

(57) ABSTRACT

A display device according to an example embodiment of the present disclosure may include a stretchable lower substrate; a pattern layer disposed on the lower substrate and including a plurality of plate patterns and a plurality of line patterns; a plurality of pixels disposed on each of the plurality of plate patterns; and a plurality of connection lines disposed on each of the plurality of line patterns to connect the plurality of pixels, wherein each of pixel circuits formed in the plurality of pixels includes at least one light emitting element, a driving transistor, a storage capacitor, and a first transistor to a fifth transistor, and a constant power voltage may be applied to the storage capacitor.

16 Claims, 25 Drawing Sheets

(56) References Cited

U.S. PATENT DOCUMENTS

| | | | | |
|---|---|---|---|---|
| 2021/0066266 A1* | 3/2021 | Jung | ................ | H01L 25/167 |
| 2021/0111167 A1* | 4/2021 | Kang | ................ | H10K 77/111 |
| 2021/0126082 A1* | 4/2021 | Yoon | ................ | H10K 59/1213 |
| 2021/0134191 A1* | 5/2021 | Jung | ................ | G09F 9/301 |
| 2021/0134772 A1* | 5/2021 | Jung | ................ | H01L 24/32 |
| 2021/0158734 A1* | 5/2021 | Kim | ................ | H05K 1/0283 |
| 2021/0210005 A1* | 7/2021 | Zhou | ................ | G09G 3/325 |
| 2022/0238623 A1* | 7/2022 | Choi | ................ | H10K 59/124 |
| 2022/0384747 A1* | 12/2022 | Sun | ................ | H10K 59/38 |
| 2023/0037433 A1* | 2/2023 | Won | ................ | H10K 77/111 |
| 2023/0056754 A1* | 2/2023 | Zeng | ................ | H10K 59/80 |
| 2023/0070511 A1* | 3/2023 | Shin | ................ | H01L 25/10 |
| 2023/0075199 A1* | 3/2023 | Tian | ................ | H10K 59/19 |
| 2023/0082757 A1* | 3/2023 | Lee | ................ | H10K 59/65 |
| | | | | 257/40 |

\* cited by examiner

STRETCHABLE DISPLAY DEVICE

CROSS-REFERENCE TO RELATED APPLICATIONS

This application claims the benefit of and priority to Korean Patent Application No. 10-2021-0190926, filed on Dec. 29, 2021 in the Republic of Korea, which is herein incorporated by reference in its entirety.

BACKGROUND

Technical Field

The present disclosure relates to a display device, and more particularly, to a stretchable display device.

Description of the Related Art

Display devices used for a computer monitor, a TV, a mobile phone, and the like may include an organic light emitting display (OLED) that emits light by itself, a liquid-crystal display (LCD) that requires a separate light source, and the like.

Such display devices are being applied to more and more various fields including not only a computer monitor and a TV, but personal mobile devices, and thus, display devices having a reduced volume and weight while having a wide active area are being studied.

Recently, a display device manufactured to be stretchable in a specific direction and changeable into various shapes by forming a display unit, lines, and the like on a flexible substrate such as plastic that is a flexible material has received considerable attention as a next-generation display device.

BRIEF SUMMARY

An aspect of the present disclosure is to provide a display device capable of minimizing the number of connection lines.

Another aspect of the present disclosure is to provide a display device including a redundancy LED.

Still another aspect of the present disclosure is to provide a display device allowing for designing of a storage capacitor with a small size.

Objects of the present disclosure are not limited to the above-mentioned objects, and other objects, which are not mentioned above, can be clearly understood by those skilled in the art from the following descriptions.

A display device according to an example embodiment of the present disclosure may include a stretchable lower substrate; a pattern layer disposed on the lower substrate and including a plurality of plate patterns and a plurality of line patterns; a plurality of pixels disposed on each of the plurality of plate patterns; and a plurality of connection lines disposed on each of the plurality of line patterns to connect the plurality of pixels, wherein each of pixel circuits formed in the plurality of pixels includes at least one light emitting element, a driving transistor, a storage capacitor, and a first transistor to a fifth transistor, and a constant power voltage may be applied to the storage capacitor.

A display device according to another example embodiment of the present disclosure may include a plurality of pixels that are spaced apart from each other and a plurality of connection lines that connect the plurality of pixels and is capable of being stretched, each of pixel circuits formed in the plurality of pixels may include at least one light emitting element, a driving transistor, a storage capacitor, and a first transistor to a fifth transistor, and one of a scan signal and an emission signal may be applied to a gate electrode of each of the first transistor to the fifth transistor.

Other matters of the example embodiments are included in the detailed description and the drawings.

According to the present disclosure, a yield of a display device can be improved by including a redundancy LED.

According to the present disclosure, even when a size of a storage capacitor Cst is designed to be small, a pixel circuit can be normally driven.

According to the present disclosure, a stretching rate and stretching reliability can be improved by reducing the number of stretching lines.

The effects according to the present disclosure are not limited to the contents exemplified above, and more various effects are included in the present specification.

DETAILED DESCRIPTION

Figure 1:
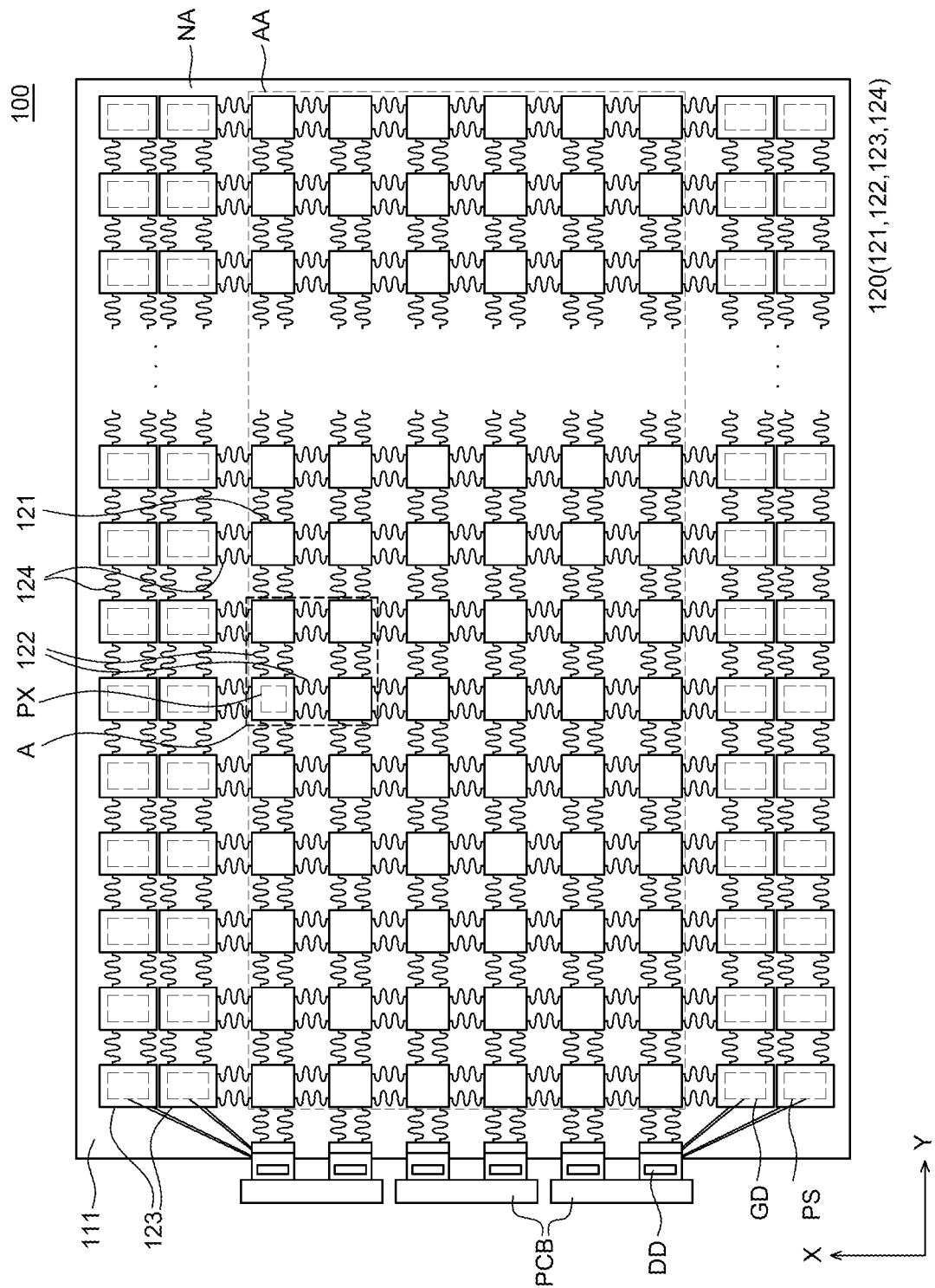
FIG. 1 is a plan view of a display device according to an example embodiment of the present disclosure.

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example so that those skilled in the art can fully understand the scope of the present disclosure.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on," "above," "below," and "next", one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

A display device according to an example embodiment of the present disclosure is a display device capable of displaying an image even if it is bent or stretched, and may also be referred to as a stretchable display device or a flexible display device. The display device may have higher flexibility and stretchability than conventional, typical display devices. Accordingly, a user can bend or stretch the display device, and a shape of the display device can be freely changed according to the user's manipulation. For example, when the user grabs and pulls an end of the display device, the display device may be stretched in a pulling direction by the user. If the user places the display device on an uneven outer surface, the display device can be disposed to be bent according to a shape of the outer surface. When force applied by the user is removed, the display device can return to an original shape thereof.

Stretchable Substrate and Pattern Layer

FIG. 1 is a plan view of a display device according to an example embodiment of the present disclosure.

Figure 2:
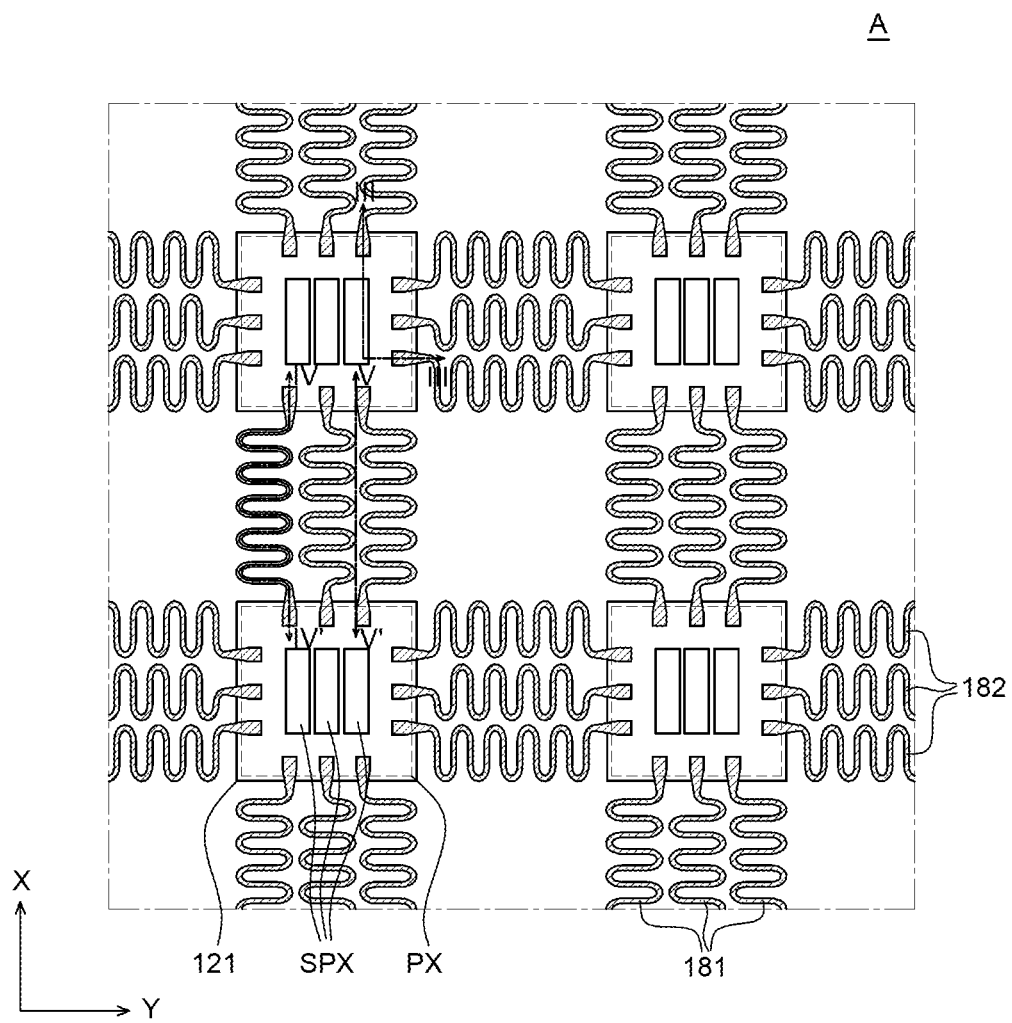
FIG. 2 is an enlarged plan view of a display area of the display device according to an example embodiment of the present disclosure.

FIG. 2 is an enlarged plan view of a display area of the display device according to an example embodiment of the present disclosure.

Figure 3:
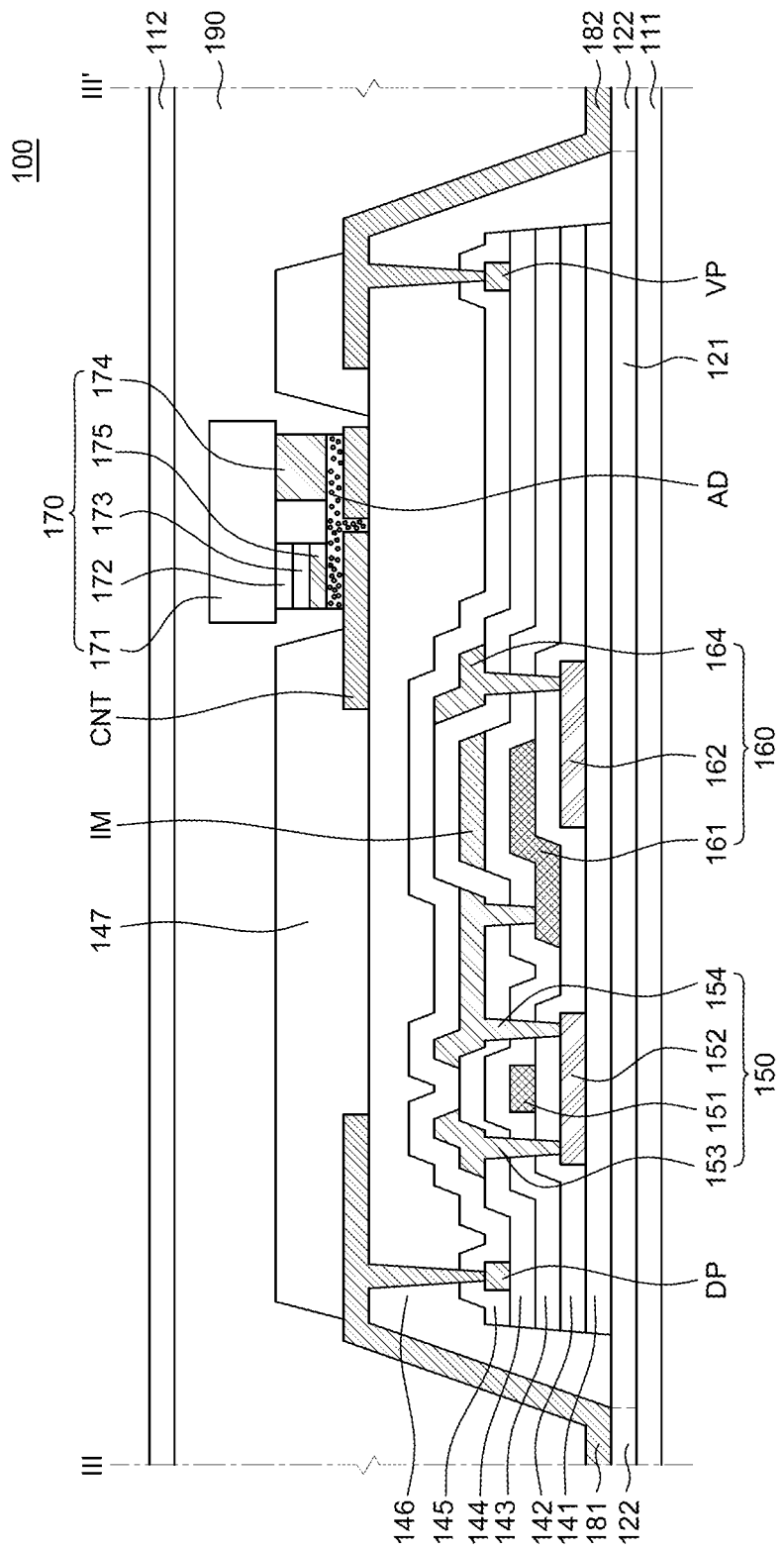
FIG. 3 is a cross-sectional view taken along cutting line III-III' shown in FIG. 2.

FIG. 3 is a cross-sectional view taken along cutting line III-III' shown in FIG. 2.

Specifically, FIG. 2 is an enlarged plan view of area A shown in FIG. 1.

Referring to FIG. 1, a display device 100 according to an example embodiment of the present disclosure may include a lower substrate 111, a pattern layer 120, a plurality of pixels PX, gate drivers GD, data drivers DD, and power supplies PS. And, referring to FIG. 1, the display device 100 according to an example embodiment of the present disclosure may further include a filling layer 190 and an upper substrate 112.

The lower substrate 111 is a substrate for supporting and protecting various components of the display device 100. In addition, the upper substrate 112 is a substrate for covering and protecting various components of the display device 100. That is, the lower substrate 111 is a substrate that supports the pattern layer 120 on which the pixels PX, the gate drivers GD, and the power supplies PS are formed. In addition, the upper substrate 112 is a substrate that covers the pixels PX, the gate drivers GD, and the power supplies PS.

Each of the lower substrate 111 and the upper substrate 112 is a ductile substrate and may be formed of an insulating material that can be bent or stretched. For example, each of the lower substrate 111 and the upper substrate 112 may be formed of silicone rubber such as polydimethylsiloxane (PDMS) or elastomers such as polyurethane (PU) and polytetrafluoroethylene (PTFE), and thus, may have flexible properties. In addition, materials of the lower substrate 111 and the upper substrate 112 may be the same, but are not limited thereto and may be variously modified.

Each of the lower substrate 111 and the upper substrate 112 is a ductile substrate and may be reversibly expandable and contractible. Accordingly, the lower substrate 111 may be referred to as a lower stretchable substrate, a lower flexible substrate, a lower extendable substrate, a lower ductile substrate, a first stretchable substrate, a first flexible substrate, a first extendable substrate, or a first ductile substrate, and the upper substrate 112 may be referred to as an upper stretchable substrate, an upper flexible substrate, an upper extendable substrate, an upper ductile substrate, a second stretchable substrate, a second flexible substrate, a second extendable substrate, or a second ductile substrate. Further, moduli of elasticity of the lower substrate 111 and the upper substrate 112 may be several MPa to several hundreds of MPa. Further, a ductile breaking rate of the lower substrate 111 and the upper substrate 112 may be 100% or higher. Here, the ductile breaking rate refers to a stretching rate at a time when an object to be stretched is broken or cracked. A thickness of the lower substrate may be 10 μm to 1 mm, but is not limited thereto.

The lower substrate 111 may have an active area AA and a non-active area NA surrounding the active area AA. However, the active area AA and the non-active area NA are not limited to the lower substrate 111 and may be referred throughout the display device.

The active area AA is an area in which an image is displayed on the display device 100. The plurality of pixels PX are disposed in the active area AA. In addition, each of the pixels PX may include a display element and various driving elements for driving the display element. The various driving elements may mean at least one thin film transistor TFT and a capacitor, but are not limited thereto. In addition, each of the plurality of pixels PX may be connected to various lines. For example, each of the plurality of pixels PX may be connected to various lines such as gate lines, data lines, high potential voltage lines, low potential voltage lines, reference voltage lines and initialization voltage lines.

The non-active area NA is an area in which an image is not displayed. The non-active area NA may be disposed adjacent to the active area AA. For example, the non-active area NA may be an area surrounding the active area AA. However, the present disclosure is not limited thereto, and the non-active area NA corresponds to an area of the lower substrate 111 excluding the active area AA and may be changed and separated into various shapes. Components for driving the plurality of pixels PX disposed in the active area AA are disposed in the non-active area NA. The gate drivers GD and power supplies PS may be disposed in the non-active area NA. In addition, a plurality of pads that are connected to the gate drivers GD and the data drivers DD may be disposed in the non-active area NA, and each of the pads may be connected to each of the plurality of pixels PX in the active area AA.

On the lower substrate 111, the pattern layer 120 including a plurality of first plate patterns 121 and a plurality of first line patterns 122 that are disposed in the active area AA and a plurality of second plate patterns 123 and a plurality of second line patterns 124 that are disposed in the non-active area NA is disposed.

The plurality of first plate patterns 121 may be disposed in the active area AA of the lower substrate 111. The plurality of pixels PX may be formed on the plurality of first plate patterns 121. In addition, the plurality of second plate patterns 123 may be disposed in the non-active area NA of the lower substrate 111. In addition, the gate drivers GD and the power supplies PS may be formed on the plurality of second plate patterns 123.

The plurality of first plate patterns 121 and the plurality of second plate patterns 123 as described above may be disposed in the form of islands that are spaced apart from each other. Each of the plurality of first plate patterns 121 and the plurality of second plate patterns 123 may be individually separated. Accordingly, the plurality of first plate patterns 121 and the plurality of second plate patterns 123 may be referred to as first island patterns and second island patterns, or first individual patterns and second individual patterns.

Specifically, the gate drivers GD may be mounted on the plurality of second plate patterns 123. The gate driver GD may be formed on the second plate pattern 123 in a gate in panel (GIP) method when various components on the first plate pattern 121 are manufactured. Accordingly, various circuit components constituting the gate drivers GD such as various transistors, capacitors, and lines may be disposed on the plurality of second plate patterns 123. However, the present disclosure is not limited thereto, and the gate driver GD may be mounted in a chip on film (COF) method.

In addition, the power supplies PS may be mounted on the plurality of second plate patterns 123. The power supply PS may be formed on the second plate pattern 123 with a plurality of power blocks that are patterned when various components on the first plate pattern 121 are manufactured. Accordingly, the power blocks disposed on different layers may be disposed on the second plate pattern 123. That is, a lower power block and an upper power block may be sequentially disposed on the second plate pattern 123. In addition, a low potential voltage may be applied to the lower power block, and a high potential voltage may be applied to the upper power block. Accordingly, the low potential voltage may be supplied to the plurality of pixels PX through the lower power block. In addition, the high potential voltage may be supplied to the plurality of pixels PX through the upper power block.

Referring to FIG. 1, sizes of the plurality of second plate patterns 123 may be greater than sizes of the plurality of first plate patterns 121. Specifically, the size of each of the plurality of second plate patterns 123 may be greater than the size of each of the plurality of first plate patterns 121. As described above, the gate driver GD may be disposed on each of the plurality of second plate patterns 123, and one stage of the gate driver GD may be disposed on each of the plurality of second plate patterns 123. Accordingly, since an area that is occupied by various circuit components constituting one stage of the gate driver GD is relatively greater than an area occupied by the pixels PX, the size of each of the plurality of second plate patterns 123 may be greater than the size of each of the first plate patterns 121.

In FIG. 1, the plurality of second plate patterns 123 are illustrated as being disposed on both sides in a first direction X in the non-active area NA, but the present disclosure is not limited thereto, and the plurality of second plate patterns 123 may be disposed in any region of the non-active area NA. In addition, although the plurality of first plate patterns 121 and the plurality of second plate patterns 123 are shown in a quadrangular shape, the present disclosure is not limited thereto, and the plurality of first plate patterns 121 and the plurality of second plate patterns 123 are changeable in various forms.

Referring to FIGS. 1 and 3, the pattern layer 120 may further include the plurality of first line patterns 122 disposed in the active area AA and the plurality of second line patterns 124 disposed in the non-active area NA.

The plurality of first line patterns 122 are patterns that are disposed in the active area AA and connect the first plate patterns 121 adjacent to each other, and may be referred to as first connection patterns. That is, the plurality of first line patterns 122 are disposed between the plurality of first plate patterns 121.

The plurality of second line patterns 124 may be patterns that are disposed in the non-active area NA and connect the first plate patterns 121 and the second plate patterns 123 adjacent to each other or the plurality of second plate patterns 123 adjacent to each other. Accordingly, the plurality of second line patterns 124 may be referred to as second connection patterns. That is, the plurality of second line patterns 124 may be disposed between the first plate patterns 121 and the second plate patterns 123 that are adjacent to each other. In addition, the plurality of second line patterns 124 may be disposed between the plurality of second plate patterns 123 adjacent to each other. Referring to FIG. 1, the plurality of first line patterns 122 and the plurality of second line patterns 124 have a wavy shape. For example, the plurality of first line patterns 122 and the plurality of second line patterns 124 may have a sine wave shape. However, the shapes of the plurality of first line patterns 122 and the plurality of second line patterns 124 are not limited thereto. For example, the plurality of first line patterns 122 and the plurality of second line patterns 124 may extend in a zigzag manner. Alternatively, the plurality of first line patterns 122 and the plurality of the second line patterns 124 may have various shapes, such as shapes in which a plurality of rhombus-shaped substrates are extended by being connected at vertices thereof. The numbers and shapes of the plurality of first line patterns 122 and the second line patterns 124 illustrated in FIG. 1 are example, and the numbers and shapes of the plurality of first line patterns 122 and the second line patterns 124 may be variously changed according to design.

In addition, the plurality of first plate patterns 121, the plurality of first line patterns 122, the plurality of second plate patterns 123, and the plurality of second line patterns 124 are rigid patterns. That is, the plurality of first plate patterns 121, the plurality of first line patterns 122, the plurality of second plate patterns 123, and the plurality of second line patterns 124 may be rigid compared to the lower substrate 111 and the upper substrate 112. Accordingly, moduli of elasticity of the plurality of first plate patterns 121, the plurality of first line patterns 122, the plurality of second plate patterns 123, and the plurality of second line patterns 124 may be higher than a modulus of elasticity of the lower substrate 111. The modulus of elasticity is a parameter representing a rate of deformation against a stress applied to the substrate. When the modulus of elasticity is relatively high, hardness may be relatively high. Accordingly, the plurality of first plate patterns 121, the plurality of first line patterns 122, the plurality of second plate patterns 123, and the plurality of second line patterns 124 may be referred to as a plurality of first rigid patterns, a plurality of second rigid patterns, a plurality of third rigid patterns, and a plurality of fourth rigid patterns, respectively. The moduli of elasticity of the plurality of first plate patterns 121, the plurality of first line patterns 122, the plurality of second plate patterns 123, and the plurality of second line patterns 124 may be 1000 times higher than the moduli of elasticity of the lower substrate 111 and the upper substrate 112, but the present disclosure is not limited thereto.

The plurality of first plate patterns 121, the plurality of first line patterns 122, the plurality of second plate patterns 123, and the plurality of second line patterns 124 that are a plurality of rigid substrates may be formed of a plastic material having flexibility that is lower than that of the lower substrate 111 and the upper substrate 112. For example, the plurality of first plate patterns 121, the plurality of first line patterns 122, the plurality of second plate patterns 123, and the plurality of second line patterns 124 may be formed of at least one material among polyimide (PI), polyacrylate, and polyacetate. In this case, the plurality of first plate patterns 121, the plurality of first line patterns 122, the plurality of second plate patterns 123, and the plurality of second line patterns 124 may be formed of the same material, but they are not limited thereto and may be formed of different materials. When the plurality of first plate patterns 121, the plurality of first line patterns 122, the plurality of second plate patterns 123, and the plurality of second line patterns 124 are formed of the same material, they may be integrally formed.

In some embodiments, the lower substrate 111 may be defined as including a plurality of first lower patterns and a second lower pattern. The plurality of first lower patterns may be areas of the lower substrate 111 that overlap the plurality of first plate patterns 121 and the plurality of second plate patterns 123. The second lower pattern may be an area that does not overlap the plurality of first plate patterns 121 and the plurality of second plate patterns 123.

Also, the upper substrate 112 may be defined as including a plurality of first upper patterns and a second upper pattern. The plurality of first upper patterns may be areas of the upper substrate 112 that overlap the plurality of first plate patterns 121 and the plurality of second plate patterns 123. The second upper pattern may be an area that does not overlap the plurality of first plate patterns 121 and the plurality of second plate patterns 123.

In this case, moduli of elasticity of the plurality of first lower patterns and first upper patterns may be greater than moduli of elasticity of the second lower patterns and the second upper patterns. For example, the plurality of first lower patterns and the first upper patterns may be formed of the same material as the plurality of first plate patterns 121 and the plurality of second plate patterns 123, and the second lower pattern and the second upper pattern may be formed of a material having a modulus of elasticity lower than those of the plurality of first plate patterns 121 and the plurality of second plate patterns 123.

]That is, the first lower pattern and the first upper pattern may be formed of polyimide (PI), polyacrylate, polyacetate, or the like and the second lower pattern and the second upper pattern may be formed of silicon rubber such as polydimethylsiloxane (PDMS) or an elastomer such as polyurethane (PU) or polytetrafluoroethylene (PTFE).

Non-Active Area Driving Element

The gate drivers GD are components which supply a gate voltage to the plurality of pixels PX disposed in the active area AA. The gate drivers GD include a plurality of stages formed on the plurality of second plate patterns 123 and respective stages of the gate drivers GD may be electrically connected to each other through a plurality of gate connection lines. Accordingly, a gate voltage output from one of stages may be transmitted to another stage. Further, the respective stages may sequentially supply the gate voltage to the plurality of pixels PX connected to the respective stages.

The power supplies PS may be connected to the gate drivers GD and supply a gate driving voltage and a gate clock voltage. Further, the power supplies PS may be connected to the plurality of pixels PX and supply a pixel driving voltage to each of the plurality of pixels PX. The power supplies PS may also be formed on the plurality of second plate patterns 123. That is, the power supplies PS may be formed on the plurality of second plate patterns 123 to be adjacent to the gate drivers GD. Further, each of the power supplies PS formed on the plurality of second plate patterns 123 may be electrically connected to the gate driver GD and the plurality of pixels PX. That is, the plurality of power supplies PS formed on the plurality of second plate patterns 123 may be connected by a gate power supply connection line and a pixel power supply connection line.

Therefore, each of the plurality of power supplies PS may supply a gate driving voltage, a gate clock voltage, and a pixel driving voltage.

The printed circuit board PCB is a component which transmits signals and voltages for driving the display element from a control unit (or a control circuit) to the display element. Therefore, the printed circuit board PCB may also be referred to as a driving substrate. A control unit such as an IC chip or a circuit may be mounted on the printed circuit board PCB. Further, a memory, a processor or the like may be mounted on the printed circuit board PCB. Further, the printed circuit board PCB provided in the display device 100 may include a stretchable area and a non-stretchable area to secure stretchability. Also, on the non-stretchable area, an IC chip, a circuit, a memory, a processor and the like may be mounted, and in the stretchable area, lines electrically connected to the IC chip, the circuit, the memory and the processor may be disposed.

The data driver DD is a component which supplies a data voltage to the plurality of pixels PX disposed in the active area AA. The data driver DD may be configured in a form of an IC chip and thus, may also be referred to as a data integrated circuit D-IC. Further, the data driver DD may be mounted on the non-stretchable area of the printed circuit board PCB. That is, the data driver DD may be mounted on the printed circuit board PCB in a form of a chip on board (COB). Although in FIG. 1, it is illustrated that the data driver DD is mounted in a chip on board (COB) manner, the present disclosure is not limited thereto and the data driver DD may be mounted in a chip on film (COF), a chip on glass (COG), a tape carrier package (TCP) manner, or the like.

Also, although it is illustrated in FIG. 1 that one data driver DD is disposed to correspond to a line of the first plate patterns 121 disposed in the active area AA, the present disclosure is not limited thereto. That is, one data driver DD may be disposed to correspond to a plurality of columns of the first plate patterns 121.

Figure 4:
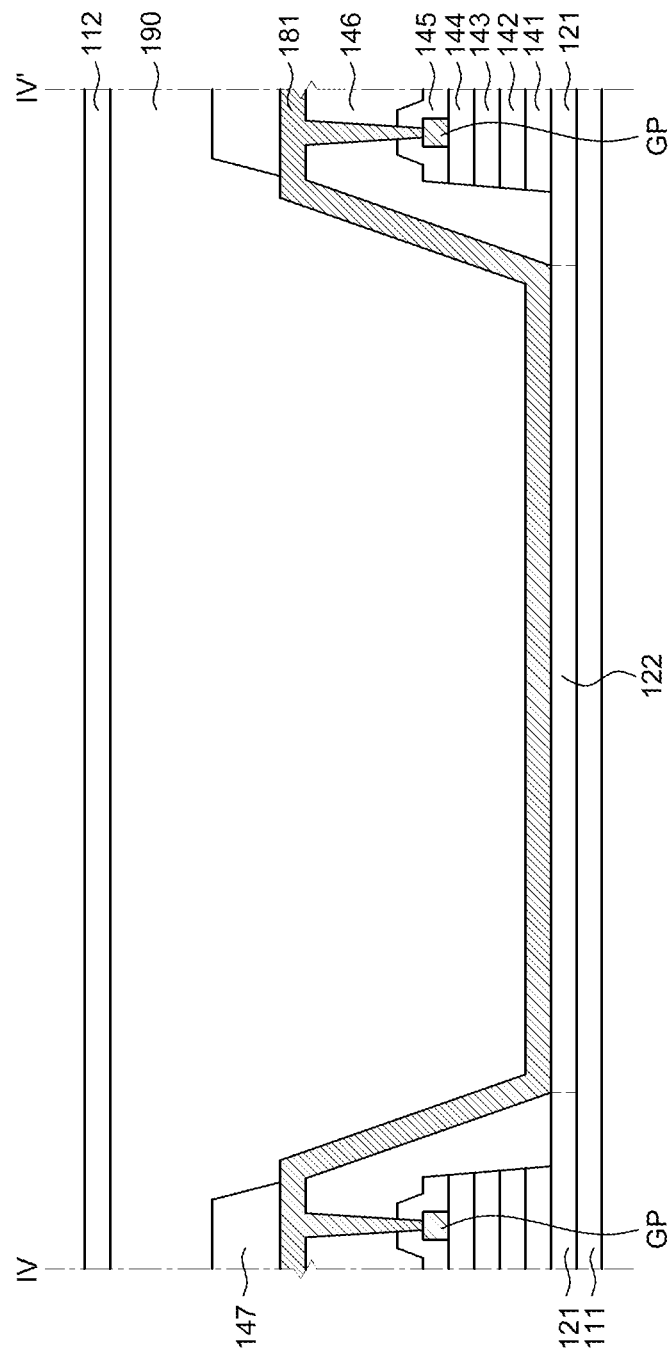
FIG. 4 is a cross-sectional view taken along cutting line IV-IV' shown in FIG. 2.
Figure 5:
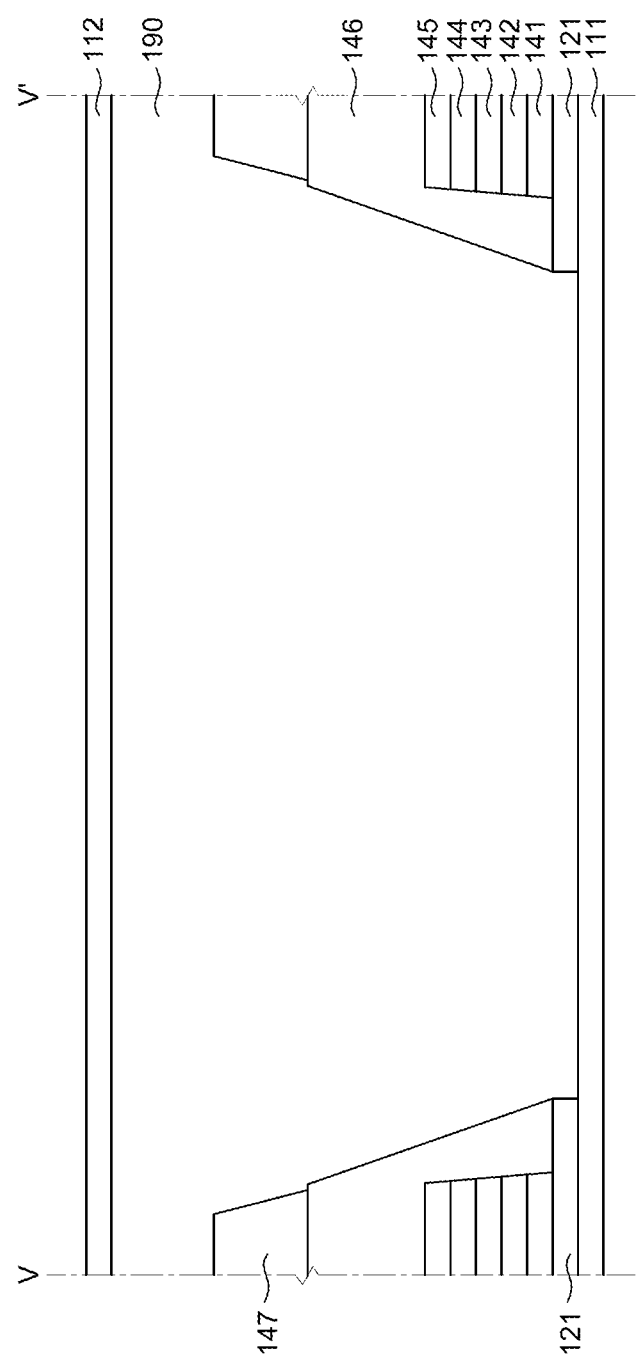
FIG. 5 is a cross-sectional view taken along cutting line V-V' shown in FIG. 2.

Hereinafter, FIGS. 4 and 5 are referred together for a more detailed description of the active area AA of the display device 100 according to an example embodiment of the present disclosure.

Planar and Cross-Sectional Structures of Active Area

FIG. 4 is a cross-sectional view taken along cutting line IV-IV' shown in FIG. 2.

FIG. 5 is a cross-sectional view taken along cutting line V-V' shown in FIG. 2.

FIGS. 1 to 3 are referred together for convenience of description.

Referring to FIG. 1 and FIG. 2, the plurality of first plate patterns 121 are disposed on the lower substrate 111 in the active area AA. The plurality of first plate patterns 121 are disposed to be spaced apart from each other on the lower substrate 111. For example, the plurality of first plate patterns 121 may be disposed in a matrix form on the lower substrate 111 as shown in FIG. 1, but are not limited thereto.

Referring to FIG. 2 and FIG. 3, a pixel PX including a plurality of sub-pixels SPX is disposed on the first plate pattern 121. Also, each of the sub-pixels SPX may include an LED 170, which is a display element and a driving transistor 160 and a switching transistor 150 for driving the LED 170. However, the display element in the sub-pixel SPX is not limited to the LED and may be an organic light emitting diode. Further, the plurality of sub-pixels SPX may include a red sub-pixel, a green sub-pixel, and a blue sub-pixel, but are not limited thereto. Colors of the plurality of sub-pixels SPX may be variously changed as needed.

The plurality of sub-pixels SPX may be connected to a plurality of connection lines 181 and 182. That is, the plurality of sub-pixels SPX may be electrically connected to the first connection lines 181 extended in the first direction X. Also, the plurality of sub-pixels SPX may be electrically connected to the second connection lines 182 extended in a second direction Y.

Hereinafter, a cross-sectional structure of the active area AA will be described in detail with reference to FIG. 3.

Referring to FIG. 3, a plurality of inorganic insulating layers are disposed on the plurality of first plate patterns 121. For example, the plurality of inorganic insulating layers may include a buffer layer 141, a gate insulating layer 142, a first interlayer insulating layer 143, a second interlayer insulating layer 144, and a passivation layer 145. However, the present disclosure is not limited thereto. Various inorganic insulating layers may be further disposed on the plurality of first plate patterns 121. One or more of the buffer layer 141, the gate insulating layer 142, the first interlayer insulating layer 143, the second interlayer insulating layer 144, and the passivation layer 145 which are inorganic insulating layers may be omitted.

Specifically, the buffer layer 141 is disposed on the plurality of first plate patterns 121. The buffer layer 141 is formed on the plurality of first plate patterns 121 to protect various components of the display device 100 against permeation of moisture ($H_2O$), oxygen ($O_2$) or the like from the outside of the lower substrate 111 and the plurality of first plate patterns 121. The buffer layer 141 may be formed of an insulating material. For example, the buffer layer 141 may be formed as a single layer or multiple layers of silicon nitride (SiNx), silicon oxide (SiOx), silicon oxynitride (SiON), or the like. However, the buffer layer 141 may be omitted depending on a structure or characteristics of the display device 100.

In this case, the buffer layer 141 may be formed only in an area where the buffer layer 141 overlaps the plurality of first plate patterns 121 and the plurality of second plate patterns 123. As described above, the buffer layer 141 may be formed of an inorganic material. Thus, the buffer layer 141 may be easily damaged, such as easily cracked, while the display device 100 is stretched. Therefore, the buffer layer 141 may not be formed in areas between the plurality of first plate patterns 121 and the plurality of second plate patterns 123. The buffer layer 141 may be patterned into shapes of the plurality of first plate patterns 121 and the plurality of second plate patterns 123 and formed only on upper portions of the plurality of first plate patterns 121 and the plurality of second plate patterns 123. Accordingly, in the display device 100 according to an example embodiment of the present disclosure, the buffer layer 141 is formed only in the area where the buffer layer 141 overlaps the plurality of first plate patterns 121 and the plurality of second plate patterns 123 which are rigid substrates, so that damage to various components of the display device 100 may be prevented even when the display device 100 is deformed, such as bent or stretched.

Referring to FIG. 3, the switching transistor 150 including a gate electrode 151, an active layer 152, a source electrode 153 and a drain electrode 154, and the driving transistor 160 including a gate electrode 161, an active layer 162, a source electrode and a drain electrode 164 are formed on the buffer layer 141.

First, referring to FIG. 1, the active layer 152 of the switching transistor 150 and the active layer 162 of the driving transistor 160 are disposed on the buffer layer 141. For example, each of the active layer 152 of the switching transistor 150 and the active layer 162 of the driving transistor 160 may be formed of an oxide semiconductor. Alternatively, the active layer 152 of the switching transistor 150 and the active layer 162 of the driving transistor 160 may be formed of amorphous silicon (a-Si), polycrystalline silicon (poly-Si), an organic semiconductor or the like.

The gate insulating layer 142 is disposed on the active layer 152 of the switching transistor 150 and the active layer 162 of the driving transistor 160. The gate insulating layer 142 is configured to electrically insulate the gate electrode 151 of the switching transistor 150 from the active layer 152 of the switching transistor 150 and electrically insulate the gate electrode 161 of the driving transistor 160 from the active layer 162 of the driving transistor 160. Further, the gate insulating layer 142 may be formed of an insulating material. For example, the gate insulating layer 142 may be formed as a single layer of silicon nitride (SiNx) or silicon oxide (SiOx) or multiple layers of silicon nitride (SiNx) or silicon oxide (SiOx), but is not limited thereto.

The gate electrode 151 of the switching transistor 150 and the gate electrode 161 of the driving transistor 160 are disposed on the gate insulating layer 142. The gate electrode 151 of the switching transistor 150 and the gate electrode 161 of the driving transistor 160 are disposed to be spaced apart from each other on the gate insulating layer 142. Further, the gate electrode 151 of the switching transistor 150 overlaps the active layer 152 of the switching transistor 150, and the gate electrode 161 of the driving transistor 160 overlaps the active layer 162 of the driving transistor 160.

Each of the gate electrode 151 of the switching transistor 150 and the gate electrode 161 of the driving transistor 160 may be formed of one of various metal materials, for example, one of molybdenum (Mo), aluminum (Al), chromium (Cr), gold (Au), titanium (Ti), nickel (Ni), neodymium (Nd) and copper (Cu). Alternatively, each of the gate electrode 151 of the switching transistor 150 and the gate electrode 161 of the driving transistor 160 may be formed of an alloy of two or more of them, or a plurality of layer thereof, but is not limited thereto.

The first interlayer insulating layer 143 is disposed on the gate electrode 151 of the switching transistor 150 and the gate electrode 161 of the driving transistor 160. The first interlayer insulating layer 143 insulates the gate electrode 161 of the driving transistor 160 from an intermediate metal layer IM. The first interlayer insulating layer 143 may also be formed of an inorganic material like the buffer layer 141. For example, the first interlayer insulating layer 143 may be formed as a single layer of silicon nitride (SiNx) or silicon oxide (SiOx) or multiple layers of silicon nitride (SiNx) or silicon oxide (SiOx), but is not limited thereto.

The intermediate metal layer IM is disposed on the first interlayer insulating layer 143. Further, the intermediate metal layer IM overlaps the gate electrode 161 of the driving transistor 160. Thus, a storage capacitor is formed in an area where the intermediate metal layer IM overlaps the gate electrode 161 of the driving transistor 160. Specifically, the gate electrode 161 of the driving transistor 160, the first interlayer insulating layer 143 and the intermediate metal layer IM form the storage capacitor. However, a position of the intermediate metal layer IM is not limited thereto. The intermediate metal layer IM may overlap another electrode to form a storage capacitor in various ways.

The intermediate metal layer IM may be formed of one of various metal materials, for example, one of molybdenum (Mo), aluminum (Al), chromium (Cr), gold (Au), titanium (Ti), nickel (Ni), neodymium (Nd) and copper (Cu). Alternatively, the intermediate metal layer IM may be formed of an alloy of two or more of them, or a plurality of layer thereof, but is not limited thereto.

The second interlayer insulating layer 144 is disposed on the intermediate metal layer IM. The second interlayer insulating layer 144 insulates the gate electrode 151 of the switching transistor 150 from the source electrode 153 and the drain electrode 154 of the switching transistor 150. Also, the second interlayer insulating layer 144 insulates the intermediate metal layer IM from the source electrode and the drain electrode 164 of the driving transistor 160. The second interlayer insulating layer 144 may also be formed of an inorganic material like the buffer layer 141. For example, the first interlayer insulating layer 143 may be formed as a single layer of silicon nitride (SiNx) or silicon oxide (SiOx) or multiple layers of silicon nitride (SiNx) or silicon oxide (SiOx), but is not limited thereto.

The source electrode 153 and the drain electrode 154 of the switching transistor 150 are disposed on the second interlayer insulating layer 144. Also, the source electrode and the drain electrode 164 of the driving transistor 160 are disposed on the second interlayer insulating layer 144. The source electrode 153 and the drain electrode 154 of the switching transistor 150 are disposed to be spaced apart from each other on the same layer. Further, although FIG. 1 does not illustrate the source electrode of the driving transistor 160, the source electrode of the driving transistor 160 is also disposed to be spaced apart from the drain electrode 164 of the driving transistor 160 on the same layer. In the switching transistor 150, the source electrode 153 and the drain electrode 154 may be electrically connected to the active layer 152 to be in contact with the active layer 152. Also, in the driving transistor 160, the source electrode and the drain electrode 164 may be electrically connected to the active layer 162 to be in contact with the active layer 162. Further, the drain electrode 154 of the switching transistor 150 may be electrically connected to the gate electrode 161 of the driving transistor 160 to be in contact with the gate electrode 161 of the driving transistor 160 through a contact hole.

The source electrode 153 and the drain electrodes 154 and 164 may be formed of one of various metal materials, for example, one of molybdenum (Mo), aluminum (Al), chromium (Cr), gold (Au), titanium (Ti), nickel (Ni), neodymium (Nd) and copper (Cu). Alternatively, the source electrode 153 and the drain electrodes 154 and 164 may be formed of an alloy of two or more of them, or a plurality of layer thereof, but are not limited thereto.

Further, in the present disclosure, the driving transistor 160 has been described as having a coplanar structure, but various types of transistors having a staggered structure or the like may also be used. Also, in the present specification, the transistor may be formed not only in a top gate structure but also in a bottom gate structure.

A gate pad GP and a data pad DP may be disposed on the second interlayer insulating layer 144.

Specifically, referring to FIG. 4, the gate pad GP serves to transfer a gate voltage to the plurality of sub-pixels SPX. The gate pad GP is connected to the first connection line 181 through a contact hole. In addition, the gate voltage supplied from the first connection line 181 may be transferred from the gate pad GP to the gate electrode 151 of the switching transistor 150 through a line formed on the first plate pattern 121.

In addition, referring to FIG. 3, the data pad DP serves to transfer a data voltage to the plurality of sub-pixels SPX. The data pad DP is connected to the second connection line 182 through a contact hole. In addition, the data voltage supplied from the second connection line 182 may be transferred from the data pad DP to the source electrode 153 of the switching transistor 150 through a line formed on the first plate pattern 121.

And, referring to FIG. 3, a voltage pad VP is a pad for transferring a low potential voltage to the plurality of sub-pixels SPX. The voltage pad VP is connected to the first connection line 181 through a contact hole. In addition, the low potential voltage supplied from the first connection line 181 may be transferred from the voltage pad VP to an n-electrode 174 of the LED 170 through a line formed on the first plate pattern 121.

The gate pad GP and the data pad DP may be formed of the same material as the source electrode 153 and the drain electrodes 154 and 164, but are not limited thereto.

Referring to FIG. 1, the passivation layer 145 is formed on the switching transistor 150 and the driving transistor 160. The passivation layer 145 covers the switching transistor 150 and the driving transistor 160 to protect the switching transistor 150 and the driving transistor 160 against permeation of moisture, oxygen, and the like. The passivation layer 145 may be formed of an inorganic material and formed as a single layer or a plurality of layers, but is not limited thereto.

Also, the gate insulating layer 142, the first interlayer insulating layer 143, the second interlayer insulating layer 144 and the passivation layer 145 may be patterned and formed only in an area where they overlap the plurality of first plate patterns 121. The gate insulating layer 142, the first interlayer insulating layer 143, the second interlayer insulating layer 144 and the passivation layer 145 may also be formed of an inorganic material like the buffer layer 141. Thus, the gate insulating layer 142, the first interlayer insulating layer 143, the second interlayer insulating layer 144 and the passivation layer 145 may be easily damaged, such as easily cracked, while the display device 100 is stretched. Therefore, the gate insulating layer 142, the first interlayer insulating layer 143, the second interlayer insulating layer 144 and the passivation layer 145 may not be formed in areas between the plurality of first plate patterns 121 and may be patterned into the shapes of the plurality of first plate patterns 121 and formed only on upper portions of the plurality of first plate patterns 121.

A planarization layer 146 is formed on the passivation layer 145. The planarization layer 146 serves to flatten upper portions of the switching transistor 150 and the driving transistor 160. The planarization layer 146 may be formed as a single layer or a plurality of layers and may be formed of an organic material. Thus, the planarization layer 146 may also be referred to as an organic insulating layer. For example, the planarization layer 146 may be formed of an acrylic-based organic material, but is not limited thereto.

Referring to FIG. 3, the planarization layer 146 may be disposed on the plurality of first plate patterns 121 so as to cover upper surfaces and side surfaces of the buffer layer 141, the gate insulating layer 142, the first interlayer insulating layer 143, the second interlayer insulating layer 144 and the passivation layer 145. In addition, the planarization layer 146 surrounds the buffer layer 141, the gate insulating layer 142, the first interlayer insulating layer 143, the second interlayer insulating layer 144 and the passivation layer 145 together with the plurality of first plate patterns 121. Specifically, the planarization layer 146 may be disposed to cover an upper surface and a side surface of the passivation layer 145, a side surface of the first interlayer insulating layer 143, a side surface of the second interlayer insulating layer 144, a side surface of the gate insulating layer 142, a side surface of the buffer layer 141 and a part of upper surfaces of the plurality of first plate patterns 121. Thus, the planarization layer 146 may compensate for steps between the side surfaces of the buffer layer 141, the gate insulating layer 142, the first interlayer insulating layer 143, the second interlayer insulating layer 144 and the passivation layer 145. Also, the planarization layer 146 may enhance adhesion strength between the planarization layer 146 and the connection lines 181 and 182 disposed on side surfaces of the planarization layer 146.

Referring to FIG. 3, an incline angle of the side surface of the planarization layer 146 may be less than those of the side surfaces of the buffer layer 141, the gate insulating layer 142, the first interlayer insulating layer 143, the second interlayer insulating layer 144 and the passivation layer 145. For example, the side surface of the planarization layer 146 may have a gentle incline than the side surface of the passivation layer 145, the side surface of the first interlayer insulating layer 143, the side surface of the second interlayer insulating layer 144, the side surface of the gate insulating layer 142 and the side surface of the buffer layer 141. Thus, the connection lines 181 and 182 in contact with the side surfaces of the planarization layer 146 are disposed to have a gentle incline. Therefore, when the display device is stretched, a stress generated in the connection lines 181 and 182 may be reduced. Also, it is possible to suppress cracks in the connection lines 181 and 182 or peeling of the connection lines 181 and 182 from the side surface of the planarization layer 146.

Referring to FIGS. 2 to 4, the connection lines 181 and 182 refer to lines that electrically connect the pads disposed on the plurality of first plate patterns 121. The connection lines 181 and 182 are disposed on the plurality of first line patterns 122. In addition, the connection lines 181 and 182 may also extend on the plurality of first plate patterns 121 to be electrically connected to the gate pad GP and the data pad DP on the plurality of first plate patterns 121. Also, referring to FIG. 1, the first line pattern 122 is not disposed in an area between the plurality of first plate patterns 121, in which the connection lines 181 and 182 are not disposed.

The connection lines 181 and 182 include the first connection lines 181 and the second connection lines 182. The first connection lines 181 and the second connection lines 182 are disposed between the plurality of first plate patterns 121. Specifically, the first connection lines 181 refer to lines extended in an X-axis direction X between the plurality of first plate patterns 121 among the connection lines 181 and 182. The second connection lines 182 refer to lines extended in a Y-axis direction between the plurality of first plate patterns 121 among the connection lines 181 and 182.

The connection lines 181 and 182 may be formed of a metal material such as copper (Cu), aluminum (Al), titanium (Ti) or molybdenum (Mo), or the connection lines 181 and 182 may have a laminated structure of metal materials such as copper/molybdenum-titanium (Cu/MoTi), titanium/aluminum/titanium (Ti/Al/Ti), or the like, but are not limited thereto.

In a display panel of a general display device, various lines such as a plurality of gate lines and a plurality of data lines are extended in straight lines and are disposed between a plurality of sub-pixels, and the plurality of sub-pixels are connected to a single signal line. Therefore, in the display panel of the general display device, various lines such as a gate line, a data line, a high potential voltage line and a reference voltage line are continuously extended on a substrate from one side to the other side of the display panel of an organic light emitting display device.

Unlike this, in the display device 100 according to an example embodiment of the present disclosure, various lines such as a gate line, a data line, a high potential voltage line, a reference voltage line, an initialization voltage line and the like which are formed in straight lines and considered to be used in a display panel of a general organic light emitting display device, are disposed only on the plurality of first plate patterns 121 and the plurality of second plate patterns 123. In the display device 100 according to an example embodiment of the present disclosure, lines formed in straight lines are disposed only on the plurality of first plate patterns 121 and the plurality of second plate patterns 123.

In the display device 100 according to an example embodiment of the present disclosure, the pads on two adjacent first plate patterns 121 may be connected by the connection lines 181 and 182. Accordingly, the connection lines 181 and 182 electrically connect the gate pads GP or the data pads DP on the two adjacent first plate patterns 121. Therefore, the display device 100 according to an example embodiment of the present disclosure may include the plurality of connection lines 181 and 182 to electrically connect various lines, such as a gate line, a data line, a high potential voltage line and a reference voltage line, between the plurality of first plate patterns 121. For example, gate lines may be disposed on the plurality of first plate patterns 121 disposed adjacent to each other in the first direction X. Also, the gate pads GP may be disposed on both ends of the gate lines. In this case, a plurality of gate pads GP on the plurality of first plate patterns 121 disposed adjacent to each other in the first direction X may be connected to each other by the first connection lines 181 serving as the gate lines. Therefore, the gate lines disposed on the plurality of first plate patterns 121 and the first connection lines 181 disposed on the first line patterns 122 may serve as single gate lines. The gate lines described above may be referred to as scan signal lines. Further, lines, such as an emission signal line, a low potential voltage line and a high potential voltage line which are extended in the first direction X among all of various lines that may be included in the display device 100, may also be electrically connected by the first connection lines 181 as described above.

Referring to FIG. 2 and FIG. 4, the first connection lines 181 may connect the gate pads GP on two first plate patterns 121 that are disposed side by side among the gate pads GP on the plurality of first plate patterns 121 disposed adjacent to each other in the first direction X. The first connection line 181 may serve as a gate line, an emission signal line, a high potential voltage line, or a low potential voltage line, but is not limited thereto. The gate pads GP on the plurality of first plate patterns 121 disposed in the first direction X may be connected by the first connection lines 181 serving as the gate lines. A single gate voltage may be transferred to the gate pads GP.

Further, referring to FIG. 2 and FIG. 3, the second connection lines 182 may connect the data pads DP on two first plate patterns 121 that are disposed side by side among the data pads DP on the plurality of first plate patterns 121 disposed adjacent to each other in the second direction Y. The second connection line 182 may serve as a data line, a high potential voltage line, a low potential voltage line or a reference voltage line, but is not limited thereto. Internal lines on the plurality of first plate patterns 121 disposed in the second direction Y may be connected by a plurality of second connection lines 182 serving as the data lines. A single data voltage may be transferred thereto.

As shown in FIG. 4, the first connection line 181 may be in contact with an upper surface and the side surface of the planarization layer 146 disposed on the first plate pattern 121. In addition, the first connection line 181 may be extended to an upper surface of the first line pattern 122. The second connection line 182 may be disposed to be in contact with the upper surface and in the side surface of the planarization layer 146 disposed on the first plate pattern 121. In addition, the second connection line 182 may be extended to the upper surface of the first line pattern 122.

However, as shown in FIG. 5, there is no need for a rigid pattern to be disposed in an area where the first connection line 181 and the second connection line 182 are not disposed. Thus, the first line pattern 122, which is a rigid pattern, is not disposed under the first connection line 181 and the second connection line 182.

Meanwhile, referring to FIG. 3, a bank 147 is formed on a connection pad CNT, the connection lines 181 and 182 and the planarization layer 146. The bank 147 is a component to distinguish adjacent sub-pixels SPX. The bank 147 is disposed to cover at least a part of the pad PD, the connection lines 181 and 182 and the planarization layer 146. The bank 147 may be formed of an insulating material. Further, the bank 147 may contain a black material. Since the bank 147 contains a black material, the bank 147 serves to hide lines which are visible through the active area AA. The bank 147 may be formed of, for example, a transparent carbon-based mixture. Specifically, the bank 147 may contain carbon black, but is not limited thereto. The bank 147 may also be formed of a transparent insulating material. Also, although a height of the bank 147 is shown to be lower than a height of the LED 170 in FIG. 1, the height of the bank 147 is not limited thereto, and the height of the bank 147 may be the same as the height of the LED 170.

Referring to FIG. 3, the LED 170 is disposed on the connection pad CNT and the first connection lines 181. The LED 170 includes an n-type layer 171, an active layer 172, a p-type layer 173, an n-electrode 174 and a p-electrode 175. The LED 170 of the display device 100 according to an example embodiment of the present disclosure has a flip-chip structure in which the n-electrode 174 and the p-electrode 175 are formed on one surface thereof.

The n-type layer 171 may be formed by injecting n-type impurities into gallium nitride (GaN) having excellent crystallinity. The n-type layer 171 may be disposed on a separate base substrate which is formed of a light emitting material.

The active layer 172 is disposed on the n-type layer 171. The active layer 172 is a light emitting layer that emits light in the LED 170 and may be formed of a nitride semiconductor, for example, indium gallium nitride (InGaN). The p-type layer 173 is disposed on the active layer 172. The p-type layer 173 may be formed by injecting p-type impurities into gallium nitride (GaN).

As described above, the LED 170 according to an example embodiment of the present disclosure is manufactured by sequentially laminating the n-type layer 171, the active layer 172, and the p-type layer 173, and then, etching a predetermined area of the layers to thereby form the n-electrode 174 and the p-electrode 175. In this case, the predetermined area is a space to separate the n-electrode 174 and the p-electrode 175 from each other and is etched to expose a part of the n-type layer 171. In other words, a surface of the LED 170 on which the n-electrode 174 and the p-electrode 175 are to be disposed may not be flat and may have different levels of height.

In this manner, the n-electrode 174 is disposed in the etched area, and the n-electrode 174 may be formed of a conductive material. In addition, the p-electrode 175 is disposed in a non-etched area, and the p-electrode 175 may also be formed of a conductive material. For example, the n-electrode 174 is disposed on the n-type layer 171 exposed by an etching process, and the p-electrode 175 is disposed on the p-type layer 173. The p-electrode 175 may be formed of the same material as the n-electrode 174.

An adhesive layer AD is disposed on upper surfaces of the connection pad CNT and the first connection lines 181 and between the connection pad CNT and the first connection lines 181. Thus, the LED 170 may be bonded onto the connection pad CNT and the first connection lines 181. In this case, the n-electrode 174 may be disposed on the first connection lines 181 and the p-electrode 175 may be disposed on the connection pad CNT.

The adhesive layer AD may be a conductive adhesive layer formed by dispersing conductive balls in an insulating base member. Thus, when heat or pressure is applied to the adhesive layer AD, the conductive balls are electrically connected to have conductive properties in a portion of the adhesive layer AD to which heat or pressure is applied. Also, an area of the adhesive layer AD to which pressure is not applied may have insulating properties. For example, the n-electrode 174 is electrically connected to the first connection lines 181 through the adhesive layer AD, and the p-electrode 175 is electrically connected to the connection pad CNT through the adhesive layer AD. After applying the adhesive layer AD to upper surfaces of the first connection lines 181 and the connection pad CNT by an inkjet method or the like, the LED 170 may be transferred onto the adhesive layer AD. Then, the LED 170 may be pressed and heated to thereby electrically connect the connection pad CNT to the p-electrode 175 and the first connection lines 181 to the n-electrode 174. However, other portions of the adhesive layer AD excluding a portion of the adhesive layer AD disposed between the n-electrode 174 and first connection lines 181 and a portion of the adhesive layer AD disposed between the p-electrode 175 and the connection pad CNT have insulating properties. Meanwhile, the adhesive layer AD may be separately disposed on each of the connection pad CNT and the first connection lines 181.

Further, the connection pad CNT is electrically connected to the drain electrode 164 of the driving transistor 160 and receives a driving voltage for driving the LED 170 from the driving transistor 160. Although FIG. 3 illustrates that the connection pad CNT and the drain electrode 164 of the driving transistor 160 are indirectly connected to each other without directly contacting them, the present disclosure is not limited thereto, and the connection pad CNT and the drain electrode 164 of the driving transistor 160 may be in direct contact. In addition, a low potential driving voltage for driving the LED 170 is applied to the first connection line 181. Accordingly, when the display device 100 is turned on, different voltage levels that are applied to the connection pad CNT and the first connection line 181 are respectively transferred to the n-electrode 174 and the p-electrode 175, so that the LED 170 emits light.

The upper substrate 112 serves to support various components disposed under the upper substrate 112. Specifically, the upper substrate 112 may be formed by coating and hardening a material for forming the upper substrate 112 on the lower substrate 111 and the first plate patterns 121. Thus, the upper substrate 112 may be disposed to be in contact with the lower substrate 111, the first plate patterns 121, the first line pattern 122 and the connection lines 181 and 182.

The upper substrate 112 may be formed of the same material as the lower substrate 111. For example, the upper substrate 112 may be formed of silicone rubber such as polydimethylsiloxane (PDMS) and an elastomer such as polyurethane (PU), and or polytetrafluoroethylene (PTFE). Thus, the upper substrate 112 may have flexibility. However, the materials of the upper substrate 112 are not limited thereto.

Meanwhile, although not shown in FIG. 3, a polarizing layer may also be disposed on the upper substrate 112. The polarizing layer polarizes light incident from the outside of the display device and reduces reflection of external light. Further, instead of the polarizing layer, other optical films or the like may be disposed on the upper substrate 112.

In addition, the filling layer 190 that is disposed on an entire surface of the lower substrate 111 and fills a gap between components disposed on the upper substrate 112 and the lower substrate 111 may be disposed. The filling layer 190 may be formed of a curable adhesive. Specifically, a material for forming the filling layer 190 is coated on the entire surface of the lower substrate 111 and then cured, so that the filling layer 190 may be disposed between components disposed on the upper substrate 112 and the lower substrate 111. For example, the filling layer 190 may be an optically clear adhesive (OCA), and may include an acrylic adhesive, a silicone adhesive, and a urethane adhesive.

Circuit Structure and Driving Method of Active Area

Figure 6A:
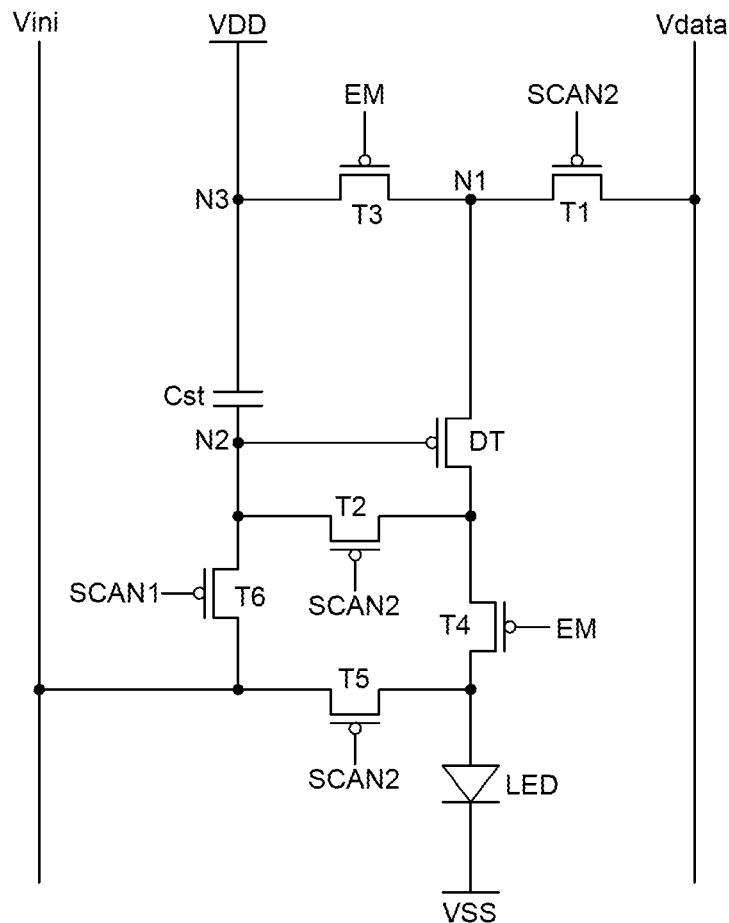
FIGS. 6A and 6B are circuit diagrams of sub-pixels of the display device according to an example embodiment of the present disclosure.
Figure 6B:
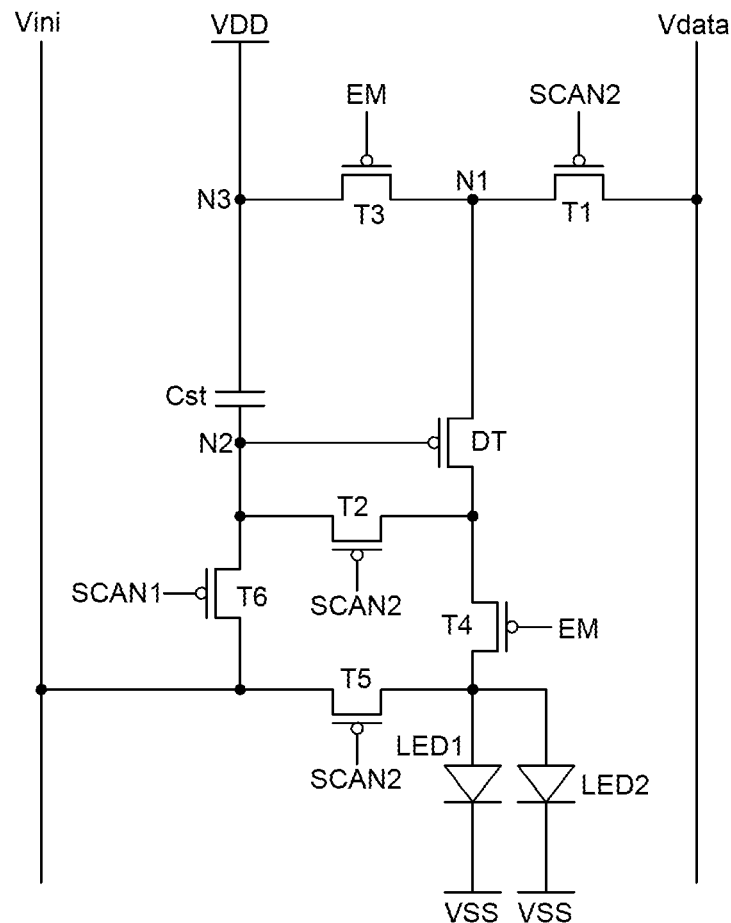

FIGS. 6A and 6B are circuit diagrams of sub-pixels of the display device according to an example embodiment of the present disclosure.

Specifically, FIG. 6A illustrates a case in which a sub-pixel of the display device according to an example embodiment of the present disclosure includes one light emitting element LED. And, FIG. 6B illustrates a case in which a sub-pixel of the display device according to an example embodiment of the present disclosure includes two light emitting elements LED1 and LED2.

For reference, the switching transistor 150 shown in FIG. 3 may correspond to a first transistor T1 of FIGS. 6A and 6B, the driving transistor 160 shown in FIG. 3 may correspond to a driving transistor DT of FIGS. 6A and 6B, and the LED 170 shown in FIG. 3 may correspond to a light emitting element LED of FIGS. 6A and 6B.

As shown in FIG. 6B, two light emitting elements LED1 and LED2 may be connected in parallel in one sub-pixel of the display device according to an example embodiment of the present disclosure. That is, respective anodes of the two light emitting elements LED1 and LED2 may be connected to each other, and respective cathodes of the two light emitting elements LED1 and LED2 may be all connected to low potential voltage VSS lines.

Accordingly, when one LED1 of the two light emitting elements LED1 and LED2 does not emit light due to transfer defects, the other one LED2 of the two LEDs LED1 and LED2 can emit light normally. That is, the other one of the two light emitting elements LED1 and LED2 may perform a function of a redundancy LED. As a result, the display device according to an example embodiment of the present disclosure includes a redundancy LED, so that a yield of the display device may be improved.

Hereinafter, a configuration and a driving method of the sub-pixel will be described in detail with reference to FIG. 6A.

Switching elements constituting each of the plurality of sub-pixels may be implemented as transistors having an n-type or p-type MOSFET structure. Although a p-type transistor is illustrated in the following embodiments, the present disclosure is not limited thereto.

Additionally, the transistor is a three-electrode element including a gate electrode, a source electrode, and a drain electrode. The source electrode is an electrode that supplies carriers to the transistor. In the transistor, the carriers begin to flow from the source electrode. The drain electrode is an electrode through which the carriers exit the transistor. That is, the carriers flow from the source electrode to the drain electrode in the MOSFET. In the case of an n-type MOSFET (NMOS), since carriers are electrons, a voltage of the source electrode is lower than a voltage of the drain electrode so that the electrons can flow from the source electrode to the drain electrode. In the n-type MOSFET, since electrons flow from the source electrode to the drain electrode, a direction of a current flows from the drain electrode to the source electrode. In the case of a p-type MOSFET (PMOS), since carriers are holes, the voltage of the source electrode is higher than the voltage of the drain electrode so that holes can flow from the source electrode to the drain electrode. In the p-type MOSFET, since holes flow from the source electrode to the drain electrode, a current flows from the source electrode to the drain electrode. It should be noted that the source electrode and drain electrode of the MOSFET are not fixed. For example, the source electrode and the drain electrode of the MOSFET may be changed according to an applied voltage. This disclosure should not be limited by the source electrode and the drain electrode of the transistor in the following embodiments.

Each of the sub-pixels includes a light emitting element LED, a driving transistor DT, a first transistor T1 to a sixth transistor T6, and a storage capacitor Cst.

The light emitting element LED emits light by a driving current supplied from the driving transistor DT. An anode electrode of the light emitting element LED is connected to a fourth transistor T4 and a fifth transistor T5, and a cathode electrode of the light emitting element LED is connected to an input terminal of a low potential voltage VSS.

The driving transistor DT controls a driving current applied to the light emitting element LED according to its gate-source voltage Vgs. In addition, a source electrode of the driving transistor DT is connected to a first node N1, a gate electrode of the driving transistor DT is connected to a second node N2, and a drain electrode of the driving transistor DT is connected to a second transistor T2 and the fourth transistor T4.

The first transistor T1 applies a data voltage Vdata supplied from the data line to the first node N1 that is the source electrode of the driving transistor DT. The first transistor T1 includes a source electrode connected to the data line, a drain electrode connected to the first node N1, and a gate electrode connected to a second scan signal line that transmits a second scan signal SCAN2. Accordingly, the first transistor T1 applies the data voltage Vdata supplied from the data line to the first node N1 that is the source electrode of the driving transistor DT in response to the second scan signal SCAN2 at a low level, which is a turn-on level.

The second transistor T2 diode-connects the gate electrode and the drain electrode of the driving transistor DT. The second transistor T2 includes a source electrode connected to the drain electrode of the driving transistor DT, a drain electrode connected to the second node N2 that is the gate electrode of the driving transistor DT, and a gate electrode connected to the second scan signal line that transmits the second scan signal SCAN2. Accordingly, the second transistor T2 diode-connects the gate electrode and the drain electrode of the driving transistor DT in response to the second scan signal SCAN2 at a low level, which is a turn-on level.

A third transistor T3 applies a high potential voltage VDD to the first node N1 that is the source electrode of the driving transistor DT. The third transistor T3 includes a source electrode connected to a third node N3 that is connected to a high potential voltage line that transmits the high potential voltage VDD, a drain electrode connected to the first node N1, and a gate electrode connected to an emission signal line that transmits an emission signal EM. Accordingly, the third transistor T3 applies the high potential voltage VDD to the first node N1 that is the source electrode of the driving transistor DT in response to the emission signal EM at a low level, which is a turn-on level.

The fourth transistor T4 forms a current path between the driving transistor DT and the light emitting element LED. The fourth transistor T4 includes a source electrode connected to the drain electrode of the driving transistor DT, a drain electrode connected to the light emitting element LED, and a gate electrode connected to the emission signal line that transmits the emission signal EM. Accordingly, the fourth transistor T4 forms a current path between the light emitting element LED and the drain electrode of the driving transistor DT in response to the emission signal EM.

The fifth transistor T5 applies an initialization voltage Vini to the anode electrode of the light emitting element LED. The fifth transistor T5 includes a source electrode connected to an initialization voltage line that transmits the initialization voltage Vini, a drain electrode connected to the anode electrode of the light emitting element LED, and a gate electrode connected to the second scan signal line that transmits the second scan signal SCAN2. Accordingly, the fifth transistor T5 applies the initialization voltage Vini to the anode electrode of the light emitting element LED in response to the second scan signal SCAN2 at a low level, which is a turn-on level.

The sixth transistor T6 applies the initialization voltage Vini to the second node N2 that is the gate electrode of the driving transistor DT. The sixth transistor T6 includes a source electrode connected to the initialization voltage line that transmits the initialization voltage Vini, a drain electrode connected to the second node N2 that is the gate electrode of the driving transistor DT, and a gate electrode connected to a first scan signal line that transmits a first scan signal SCAN1. Accordingly, the sixth transistor T6 applies the initialization voltage Vini to the second node N2 that is the gate electrode of the driving transistor DT in response to the first scan signal SCAN1 at a low level, which is a turn-on level.

The storage capacitor Cst includes a first electrode connected to the second node N2 and a second electrode connected to the third node N3. That is, one electrode of the storage capacitor Cst is connected to the gate electrode of the driving transistor DT, and the other electrode of the storage capacitor Cst is connected to the high potential voltage line that transmits the high potential voltage VDD.

Figure 7:
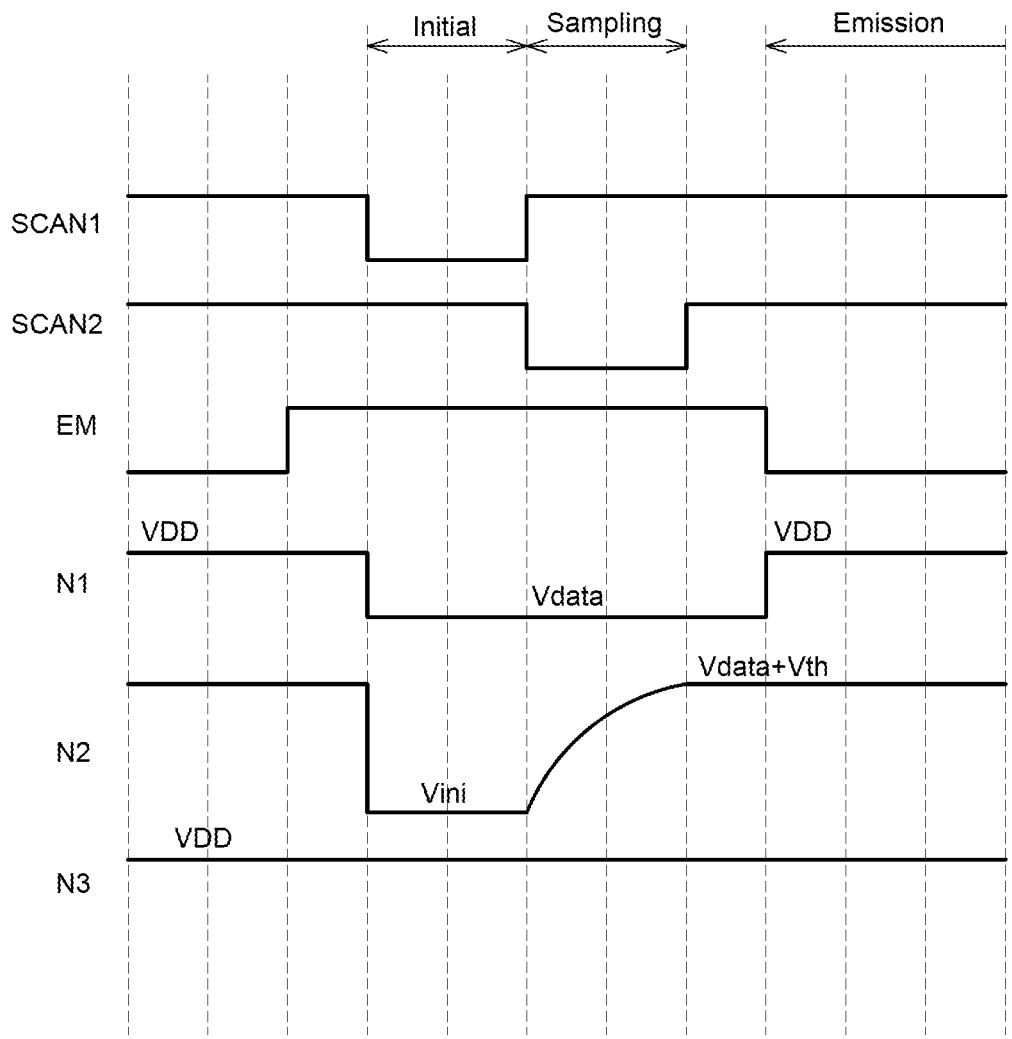
FIG. 7 is a waveform diagram illustrating an emission signal and a scan signal of the display device according to an example embodiment of the present disclosure.

FIG. 7 is a waveform diagram illustrating an emission signal and a scan signal of the display device according to an example embodiment of the present disclosure.

Figure 8A:
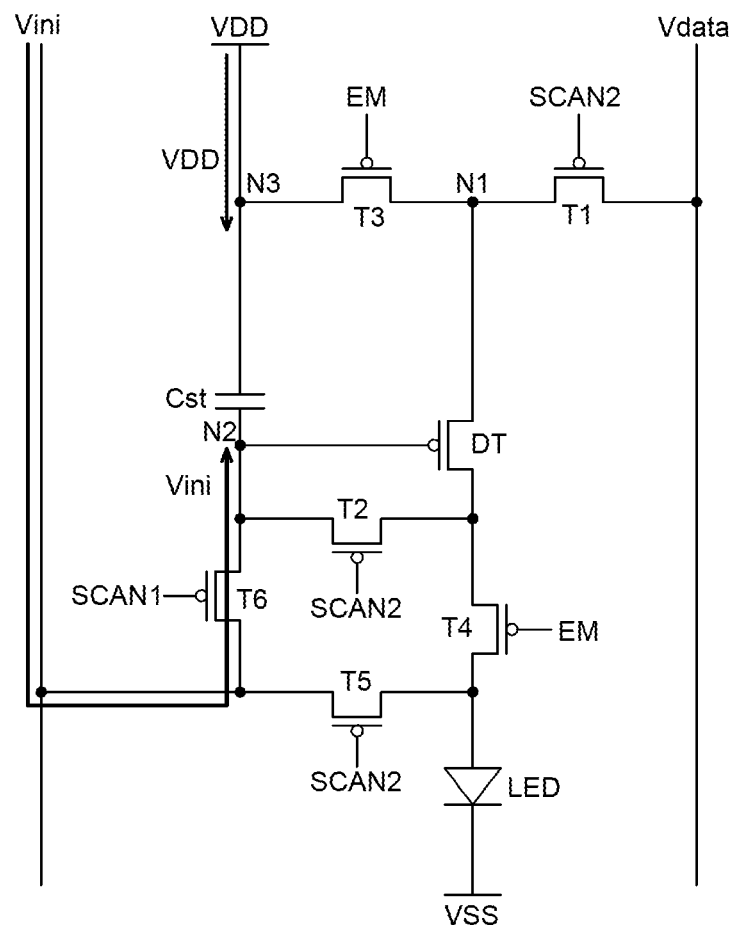
FIG. 8A is a circuit diagram of a pixel of the display device according to an example embodiment of the present disclosure during an initial period.

FIG. 8A is a circuit diagram of a pixel of the display device according to an example embodiment of the present disclosure during an initial period.

Figure 8B:
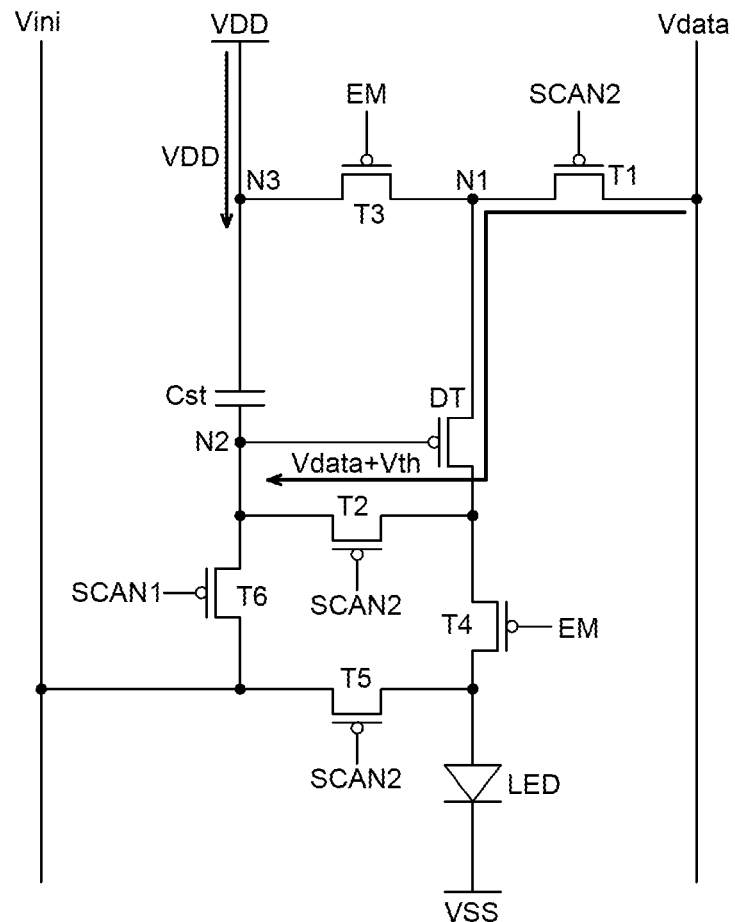
FIG. 8B is a circuit diagram of a pixel of the display device according to an example embodiment of the present disclosure during a sampling period.

FIG. 8B is a circuit diagram of a pixel of the display device according to an example embodiment of the present disclosure during a sampling period.

Figure 8C:
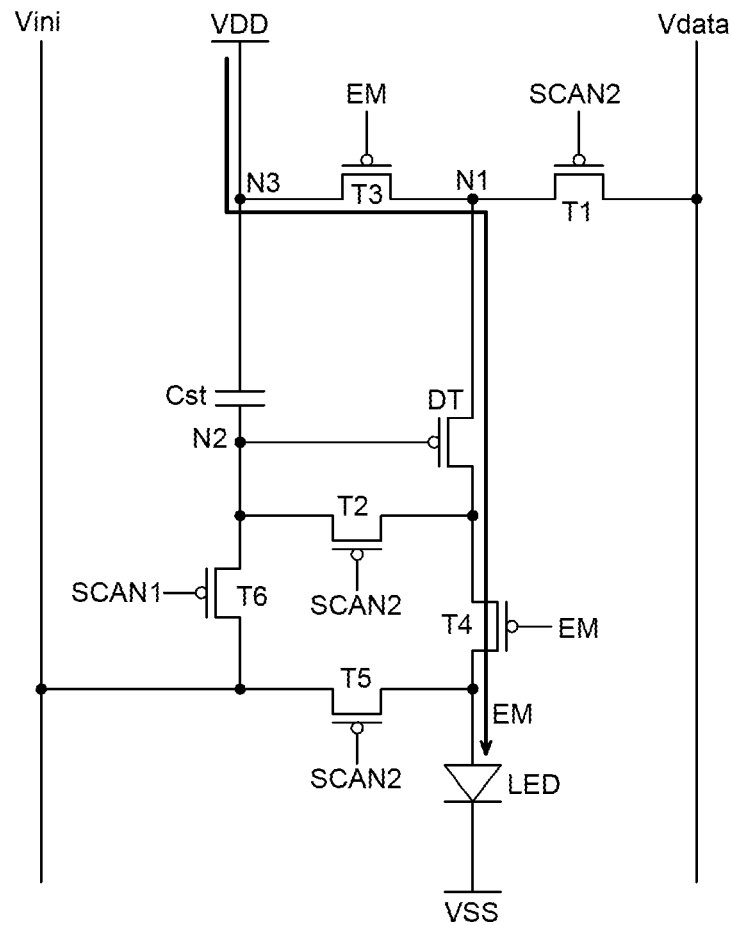
FIG. 8C is a circuit diagram of a pixel of the display device according to an example embodiment of the present disclosure during an emission period.

FIG. 8C is a circuit diagram of a pixel of the display device according to an example embodiment of the present disclosure during an emission period.

Referring to FIGS. 7 to 8C, a driving of the display device according to an example embodiment of the present disclosure will be described as follows.

And, referring to FIGS. 7 and 8A, during an initial period Initial, the first scan signal SCAN1 is a low level, which is a turn-on level, the second scan signal SCAN2 is a high level, which is a turn-off level, and the emission signal EM is a high level, which is a turn-off level. Accordingly, the sixth transistor T6 is turned on to apply the initialization voltage Vini to the second node N2. As a result, the gate electrode of the driving transistor DT is initialized to the initialization voltage Vini. The initialization voltage Vini may be selected within a voltage range that is sufficiently lower than an operating voltage of the light emitting element LED, and may be set to a voltage that is equal to or lower than the low potential voltage VSS. And, in the initial period Initial, the high potential voltage VDD is maintained at the third node N3.

And, referring to FIGS. 7 and 8B, during a sampling period Sampling, the first scan signal SCAN1 is a high level, which is a turn-off level, the second scan signal SCAN2 is a low level, which is a turn-on level, and the emission signal EM is a high level, which is a turn-off level. And, during the sampling period Sampling, the first transistor T1 is turned on, so that the data voltage Vdata is applied to the first node N1. In addition, as the second transistor T2 is also turned on, the driving transistor DT is diode-connected and the gate electrode and the drain electrode of the driving transistor DT are short-circuited, so that the driving transistor DT operates like a diode.

In the sampling period Sampling, a current flows between a source and a drain of the driving transistor DT. Since the gate electrode and the drain electrode of the driving transistor DT are in a diode-connected state, a voltage of the second node N2 increases by the current flowing from the source electrode to the drain electrode until the gate-source voltage Vgs of the driving transistor DT becomes Vth. During the sampling period Sampling, the voltage of the second node N2 is charged to a voltage Vdata+Vth corresponding to the sum of the data voltage Vdata and a threshold voltage Vth of the driving transistor DT.

Meanwhile, in the sampling period Sampling, the fifth transistor T5 is turned on to apply the initialization voltage Vini to the anode electrode of the light emitting element LED. And, even in the sampling period Sampling, the high potential voltage VDD is maintained at the third node N3.

And, referring to FIGS. 7 and 8C, during an emission period Emission, the first scan signal SCAN1 is a high level, which is a turn-off level, the second scan signal SCAN2 is a high level, which is a turn-off level, and the emission signal EM is a low level, which is a turn-on level. Accordingly, the third transistor T3 is turned on to apply the high potential voltage VDD to the first node N1. In addition, the fourth transistor T4 is also turned on to form a current path between the driving transistor DT and the light emitting element LED. As a result, a driving current that passes through the source electrode and the drain electrode of the driving transistor DT is applied to the light emitting element LED.

That is, the voltage of the second node N2 that is the gate electrode of the driving transistor DT is the voltage Vdata+Vth corresponding to the sum of the data voltage Vdata and the threshold voltage Vth of the driving transistor DT, and a voltage of the first node N1 that is the source electrode of the driving transistor DT is the high potential voltage VDD. Accordingly, the gate-source voltage Vgs of the driving transistor DT may be Vdata+Vth−VDD.

During the emission period Emission, a relational expression with respect to a driving current Iled flowing through the light emitting element LED is as in the following Equation 1.

$$Iled = k*(Vgs-Vth)^2 = k*(Vdata+Vth-VDD-Vth)^2 = k*(Vdata-VDD)^2 \quad \text{Equation 1}$$

In Equation 1, k represents a proportional constant determined by electron mobility, parasitic capacitance, and channel capacitance of the driving transistor DT.

As shown in Equation 1, a threshold voltage Vth component of the driving transistor DT is erased in the relational expression of the driving current Iled. This means that in the display device according to the present disclosure, even if the threshold voltage Vth changes, the driving current Iled does not change. That is, the display device according to an example embodiment of the present disclosure can program the data voltage regardless of the amount of change in the threshold voltage Vth.

In addition, in the display device according to an example embodiment of the present disclosure, the high potential voltage VDD, which is a constant power voltage, is applied to the storage capacitor Cst. Due to this, the storage capacitor Cst may be stabilized, so that a pixel circuit may be normally driven even if a size of the storage capacitor Cst is designed to be small. Accordingly, an area occupied by the storage capacitor Cst in one sub-pixel is reduced, so that a redundancy LED can be disposed in the sub-pixel as shown in FIG. 6B. As a result, due to the circuit structure described above, the yield of the display device according to an example embodiment of the present disclosure may be improved.

Hereinafter, a display device according to another example embodiment of the present disclosure will be described. An example embodiment of the present disclosure and another example embodiment of the present disclosure have differences in terms of a circuit configuration and driving method of the sub-pixel. Therefore, descriptions of overlapping parts of an example embodiment of the present disclosure and another example embodiment of the present disclosure may be omitted, and the differences between an example embodiment of the present disclosure and another example embodiment of the present disclosure may be described.

Figure 9A:
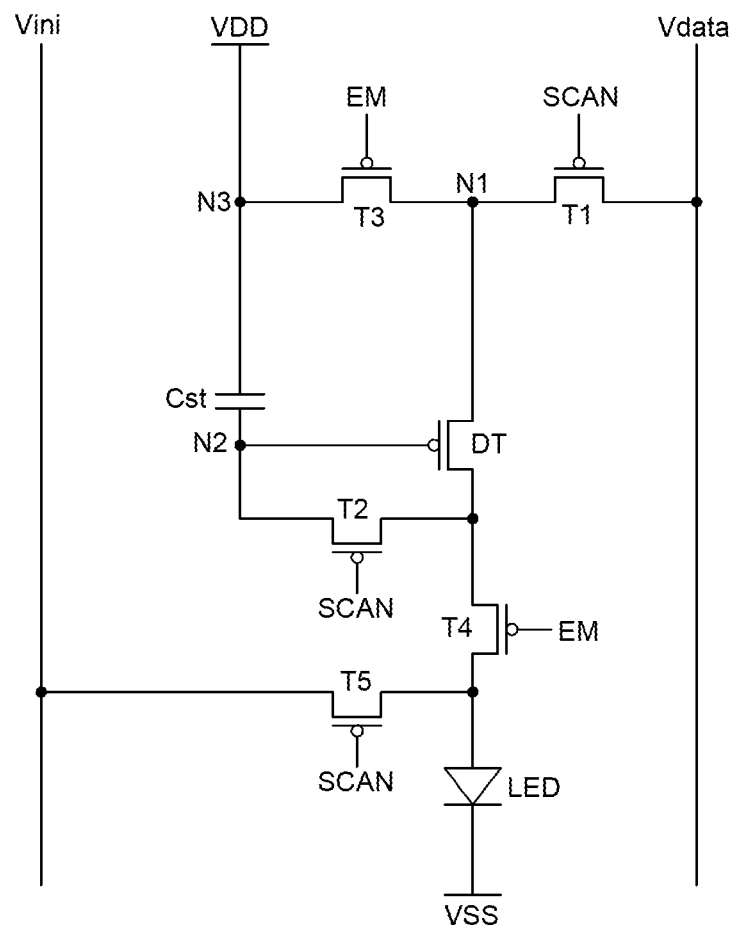
FIGS. 9A and 9B are circuit diagrams of sub-pixels of a display device according to another example embodiment of the present disclosure.
Figure 9B:
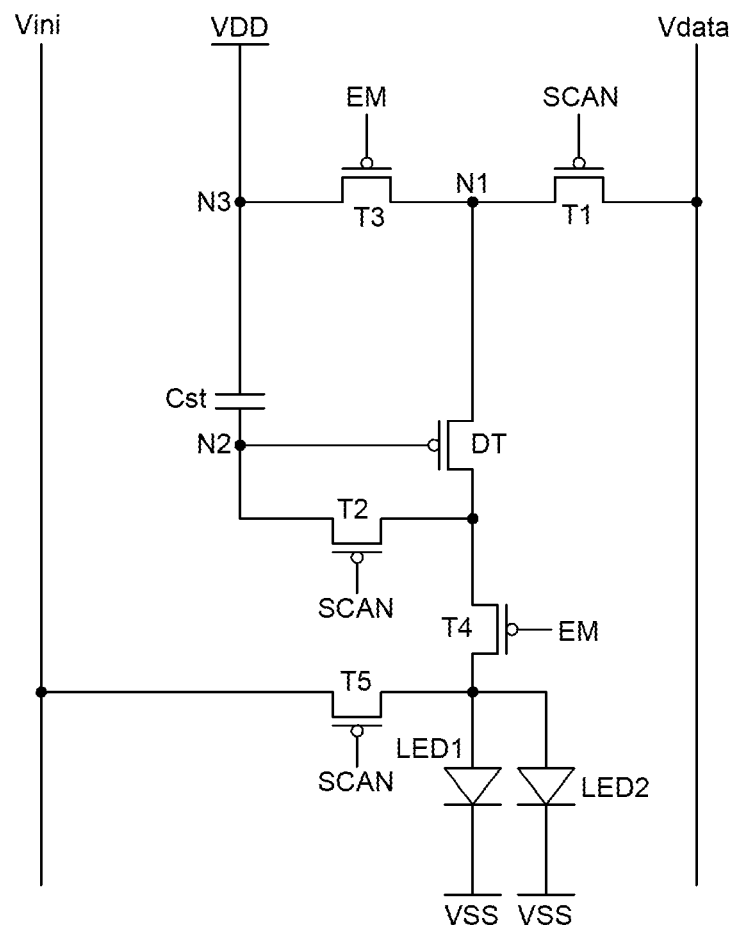

FIGS. 9A and 9B are circuit diagrams of sub-pixels of a display device according to another example embodiment of the present disclosure.

Specifically, FIG. 9A illustrates a case in which a sub-pixel of the display device according to another example embodiment of the present disclosure includes one light emitting element LED. And, FIG. 9B illustrates a case in which a sub-pixel of the display device according to another example embodiment of the present disclosure includes two light emitting elements LED1 and LED2.

For reference, the switching transistor 150 shown in FIG. 3 may correspond to a first transistor T1 of FIGS. 9A and 9B, the driving transistor 160 shown in FIG. 3 may correspond to a driving transistor DT of FIGS. 9A and 9B, and the LED 170 shown in FIG. 3 may correspond to a light emitting element LED of FIGS. 9A and 9B.

As shown in FIG. 9B, two light emitting elements LED1 and LED2 may be connected in parallel in one sub-pixel of the display device according to another example embodiment of the present disclosure. That is, respective anodes of the two light emitting elements LED1 and LED2 may be connected to each other, and respective cathodes of the two light emitting elements LED1 and LED2 may be all connected to low potential voltage VSS lines.

Accordingly, when one LED1 of the two light emitting elements LED1 and LED2 does not emit light due to transfer defects, the other one LED2 of the two LEDs LED1 and LED2 can emit light normally. That is, the other one of the two light emitting elements LED1 and LED2 may perform a function of a redundancy LED. As a result, the display device according to an example embodiment of the present disclosure includes a redundancy LED, so that a yield of the display device may be improved.

Hereinafter, a configuration and a driving method of the sub-pixel will be described in detail with reference to FIG. 9A.

In the display device according to another example embodiment of the present disclosure, each of the sub-pixels includes a light emitting element LED, a driving transistor DT, a first transistor T1 to a fifth transistor T5, and a storage capacitor Cst.

The light emitting element LED emits light by a driving current supplied from the driving transistor DT. An anode electrode of the light emitting element LED is connected to a fourth transistor T4 and the fifth transistor T5, and a cathode electrode of the light emitting element LED is connected to an input terminal of a low potential voltage VSS.

The driving transistor DT controls a driving current applied to the light emitting element LED according to its gate-source voltage Vgs. In addition, a source electrode of the driving transistor DT is connected to a first node N1, a gate electrode of the driving transistor DT is connected to a second node N2, and a drain electrode of the driving transistor DT is connected to a second transistor T2 and the fourth transistor T4.

The first transistor T1 applies a data voltage Vdata supplied from the data line to the first node N1 that is the source electrode of the driving transistor DT. The first transistor T1 includes a source electrode connected to the data line, a drain electrode connected to the first node N1, and a gate electrode connected to a scan signal line that transmits a scan signal SCAN. Accordingly, the first transistor T1 applies the data voltage Vdata supplied from the data line to the first node N1 that is the source electrode of the driving transistor DT in response to the scan signal SCAN at a low level, which is a turn-on level.

The second transistor T2 diode-connects the gate electrode and the drain electrode of the driving transistor DT. The second transistor T2 includes a source electrode connected to the drain electrode of the driving transistor DT, a drain electrode connected to the second node N2 that is the gate electrode of the driving transistor DT, and a gate electrode connected to the scan signal line that transmits the scan signal SCAN. Accordingly, the second transistor T2 diode-connects the gate electrode and the drain electrode of the driving transistor DT in response to the scan signal SCAN at a low level, which is a turn-on level.

The third transistor T3 applies a high potential voltage VDD to the first node N1 that is the source electrode of the driving transistor DT. The third transistor T3 includes a source electrode connected to a third node N3 that is connected to a high potential voltage line that transmits the high potential voltage VDD, a drain electrode connected to the first node N1, and a gate electrode connected to an emission signal line that transmits an emission signal EM. Accordingly, the third transistor T3 applies the high potential voltage VDD to the first node N1 that is the source electrode of the driving transistor DT in response to the emission signal EM at a low level, which is a turn-on level.

The fourth transistor T4 forms a current path between the driving transistor DT and the light emitting element LED. The fourth transistor T4 includes a source electrode connected to the drain electrode of the driving transistor DT, a drain electrode connected to the light emitting element LED, and a gate electrode connected to the emission signal line that transmits the emission signal EM. Accordingly, the fourth transistor T4 forms a current path between the light emitting element LED and the drain electrode of the driving transistor DT in response to the emission signal EM.

The fifth transistor T5 applies an initialization voltage Vini to the anode electrode of the light emitting element LED. The fifth transistor T5 includes a source electrode connected to an initialization voltage line that transmits the initialization voltage Vini, a drain electrode connected to the anode electrode of the light emitting element LED, and a gate electrode connected to the scan signal line that transmits the scan signal SCAN. Accordingly, the fifth transistor T5 applies the initialization voltage Vini to the anode electrode of the light emitting element LED in response to the scan signal SCAN at a low level, which is a turn-on level.

The storage capacitor Cst includes a first electrode connected to the second node N2 and a second electrode connected to the third node N3. That is, one electrode of the storage capacitor Cst is connected to the gate electrode of the driving transistor DT, and the other electrode of the storage capacitor Cst is connected to the high potential voltage line that transmits the high potential voltage VDD.

Figure 10:
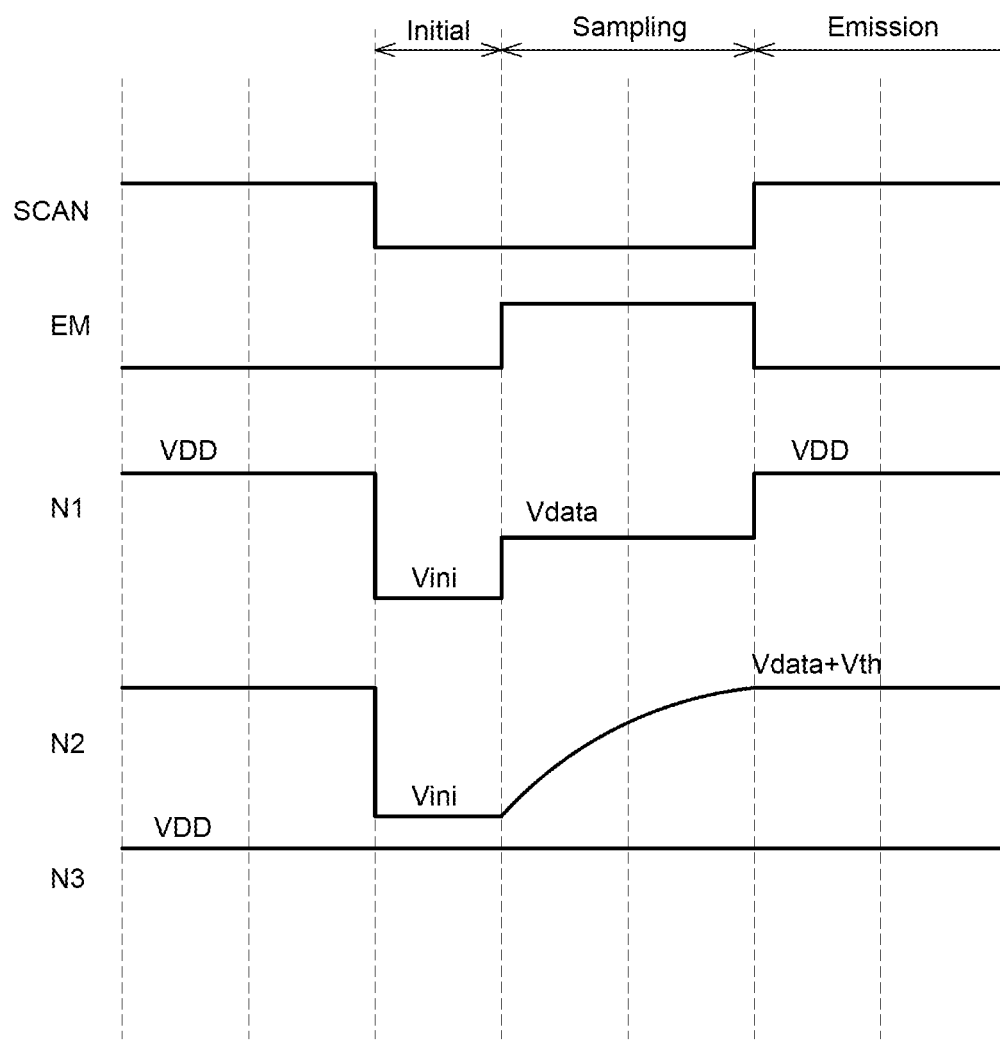
FIG. 10 is a waveform diagram illustrating an emission signal and a scan signal of the display device according to another example embodiment of the present disclosure.

FIG. 10 is a waveform diagram illustrating an emission signal and a scan signal of the display device according to another example embodiment of the present disclosure.

Figure 11A:
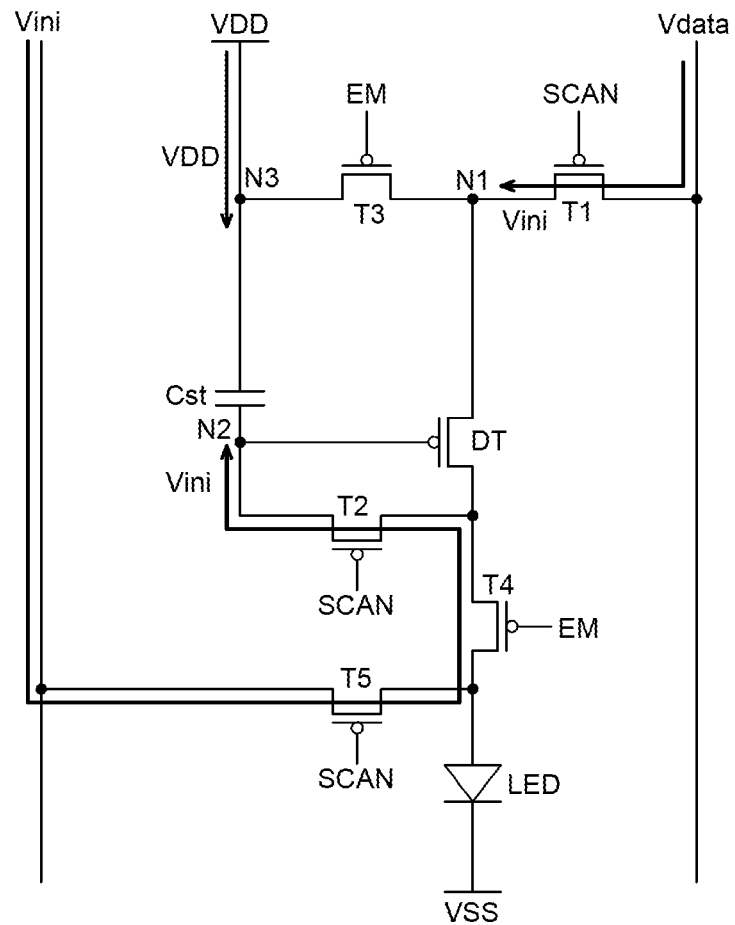
FIG. 11A is a circuit diagram of a pixel of the display device according to another example embodiment of the present disclosure during an initial period.

FIG. 11A is a circuit diagram of a pixel of the display device according to another example embodiment of the present disclosure during an initial period.

Figure 11B:
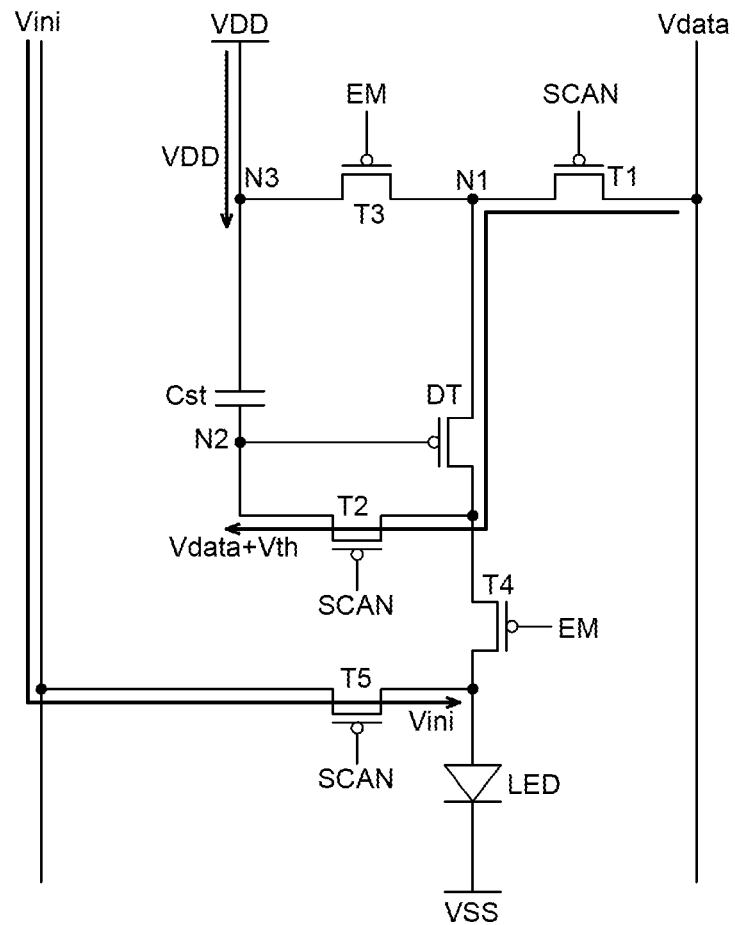
FIG. 11B is a circuit diagram of a pixel of the display device according to another example embodiment of the present disclosure during a sampling period.

FIG. 11B is a circuit diagram of a pixel of the display device according to another example embodiment of the present disclosure during a sampling period.

Figure 11C:
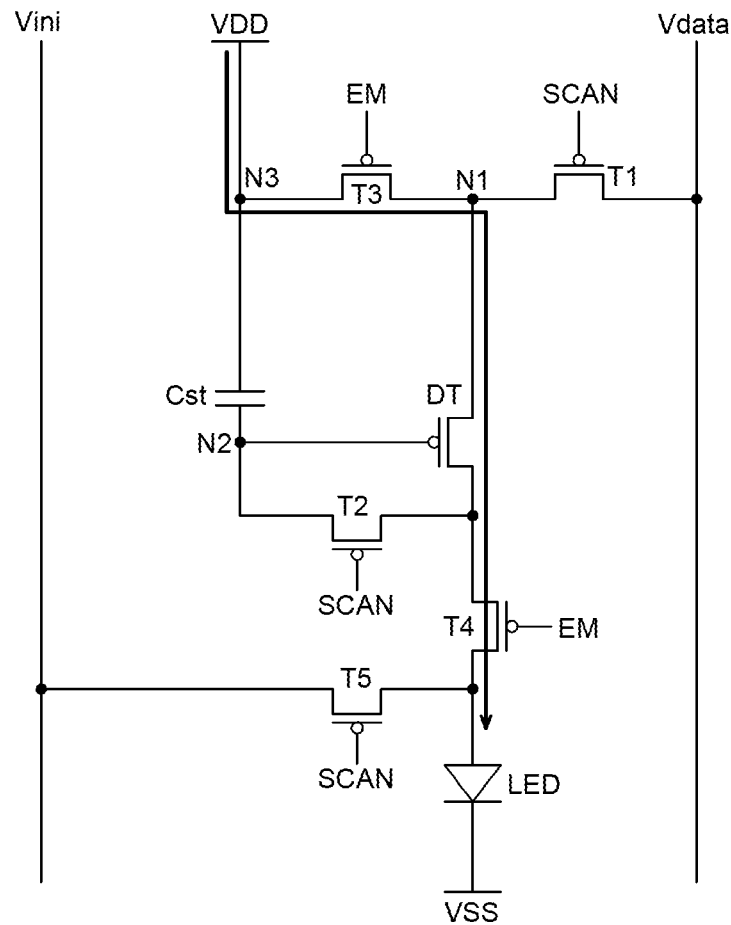
FIG. 11C is a circuit diagram of a pixel of the display device according to another example embodiment of the present disclosure during an emission period.

FIG. 11C is a circuit diagram of a pixel of the display device according to another example embodiment of the present disclosure during an emission period.

A driving of the display device according to another example embodiment of the present disclosure will be described with reference to FIGS. 10 to 11C.

And, referring to FIGS. 10 and 11A, during an initial period Initial, the scan signal SCAN is a low level, which is a turn-on level, and the emission signal EM is a low level, which is a turn-on level. Accordingly, the second transistor T2, the fourth transistor T4, and the fifth transistor T5 are turned on to apply the initialization voltage Vini to the second node N2. As a result, the gate electrode of the driving transistor DT is initialized to the initialization voltage Vini. The initialization voltage Vini may be selected within a voltage range that is sufficiently lower than an operating voltage of the light emitting element LED, and may be set to a voltage that is equal to or lower than the low potential voltage VSS.

In addition, in the initial period Initial, the first transistor T1 is turned on, and the data voltage Vdata may be equal to the initialization voltage Vini. Accordingly, the initialization voltage Vini is applied to the first node N1. And, in the initial period Initial, the high potential voltage VDD is maintained at the third node N3.

And, referring to FIGS. 10 and 11B, during a sampling period Sampling, the scan signal SCAN is a low level, which is a turn-on level, and the emission signal EM is a high level, which is a turn-off level. And, during the sampling period Sampling, the first transistor T1 is turned on, so that the data voltage Vdata is applied to the first node N1. In addition, as the second transistor T2 is also turned on, the driving transistor DT is diode-connected and the gate electrode and the drain electrode of the driving transistor DT are short-circuited, so that the driving transistor DT operates like a diode.

In the sampling period Sampling, a current flows between the source and the drain of the driving transistor DT. Since the gate electrode and the drain electrode of the driving transistor DT are in a diode-connected state, a voltage of the second node N2 increases by the current flowing from the source electrode to the drain electrode until the gate-source voltage Vgs of the driving transistor DT becomes Vth. During the sampling period Sampling, the voltage of the second node N2 is charged to a voltage Vdata+Vth corresponding to the sum of the data voltage Vdata and a threshold voltage Vth of the driving transistor DT.

Meanwhile, in the sampling period Sampling, the fifth transistor T5 is turned on to apply the initialization voltage Vini to the anode electrode of the light emitting element LED. And, even in the sampling period Sampling, the high potential voltage VDD is maintained at the third node N3.

And, referring to FIGS. 10 and 11C, during an emission period Emission, the scan signal SCAN is a high level, which is a turn-off level, and the emission signal EM is a low level, which is a turn-on level. Accordingly, the third transistor T3 is turned on to apply the high potential voltage VDD to the first node N1. In addition, the fourth transistor T4 is also turned on to form a current path between the driving transistor DT and the light emitting element LED. As a result, a driving current that passes through the source electrode and the drain electrode of the driving transistor DT is applied to the light emitting element LED.

That is, the voltage of the second node N2 that is the gate electrode of the driving transistor DT is the voltage Vdata+Vth corresponding to the sum of the data voltage Vdata and the threshold voltage Vth of the driving transistor DT, and a voltage of the first node N1 that is the source electrode of the driving transistor DT is the high potential voltage VDD. Accordingly, the gate-source voltage Vgs of the driving transistor DT may be Vdata+Vth−VDD.

During the emission period Emission, a relational expression with respect to a driving current flowing through the light emitting element LED is as in the following Equation 1.

$$Iled=k*(Vgs-Vth)^2=k*(Vdata+Vth-VDD-Vth)^2=k*(Vdata-VDD)^2 \quad \text{Equation 1}$$

In Equation 1, k represents a proportional constant determined by electron mobility, parasitic capacitance, and channel capacitance of the driving transistor DT.

As shown in Equation 1, a threshold voltage Vth component of the driving transistor DT is erased in the relational expression of the driving current Iled. This means that in the display device according to the present disclosure, even if the threshold voltage Vth changes, the driving current Iled does not change. That is, the display device according to another example embodiment of the present disclosure can program the data voltage regardless of the amount of change in the threshold voltage Vth.

In addition, in the display device according to another example embodiment of the present disclosure, the high potential voltage VDD, which is a constant power voltage, is applied to the storage capacitor Cst. Due to this, the storage capacitor Cst may be stabilized, so that a pixel circuit may be normally driven even if a size of the storage capacitor Cst is designed to be small. Accordingly, an area occupied by the storage capacitor Cst in one sub-pixel is reduced, so that a redundancy LED can be disposed in the sub-pixel as shown in FIG. 9B. As a result, due to the circuit structure described above, the yield of the display device according to another example embodiment of the present disclosure may be improved.

In addition, the display device according to another example embodiment of the present disclosure may allow for a reduction in the number of scan lines compared to the display device according to an example embodiment of the present disclosure. Accordingly, it is possible to reduce the number of stretched lines in the display device according to another example embodiment of the present disclosure. Accordingly, due to a reduction in the number of stretching lines, a stretching ratio and stretching reliability may be improved. A detailed description thereof will be described with reference to FIGS. 12 and 13.

Figure 12:
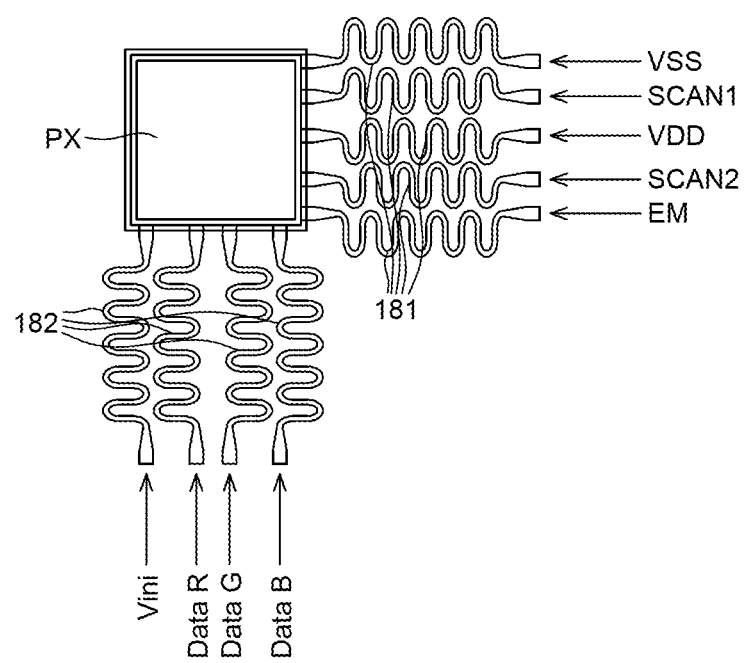
FIG. 12 is a view for explaining an arrangement relationship of connection lines of the display device according to an example embodiment of the present disclosure.

FIG. 12 is a view for explaining an arrangement relationship of connection lines of the display device according to an example embodiment of the present disclosure.

Figure 13:
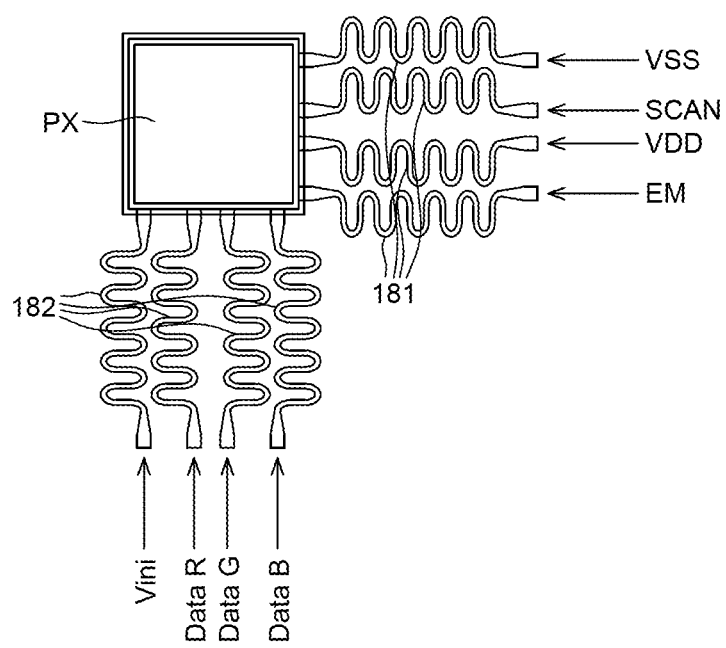
FIG. 13 is a view for explaining an arrangement relationship of connection lines of the display device according to another example embodiment of the present disclosure.

FIG. 13 is a view for explaining an arrangement relationship of connection lines of a display device according to another example embodiment of the present disclosure.

As illustrated in FIG. 12, in the display device according to an example embodiment of the present disclosure, five first connection lines 181 that are connected to one pixel PX are required and four second connection lines 182 that are connected to one pixel PX are required.

Specifically, each of the five first connection lines 181 includes a first scan signal line that transmits a first scan signal SCAN1, a second scan signal line that transmits a second scan signal SCAN2, an emission signal line that transmits an emission signal EM, a low potential voltage line that transmits a low potential voltage VSS, and a high potential voltage line that transmits a high potential voltage VDD. In addition, each of the four second connection lines 182 includes a red data line that transmits a red data voltage Data_R, a green data line that transmits a green data voltage Data_G, a blue data line that transmits a blue data voltage Data_B, and an initialization voltage line that transmits an initialization voltage Vini.

In the display device according to an example embodiment of the present disclosure, a stretching rate (or a stretching length ratio) based on the first connection line 181 extending in the first direction X is as follows. A length of the first connection line 181 in the first direction X before the first connection line 181 is stretched on the basis of 100 ppi (pixel per inch) is 127 µm, and a length in the first direction X of the first connection line 181 that is fully stretched is 183 µm. Accordingly, in the display device according to an example embodiment of the present disclosure, a stretching rate (or a stretching length ratio) based on the first connection line 181 extending in the first direction X is 1.4 (=183 µm/127 µm).

Unlike this, as shown in FIG. 13, in the display device according to another example embodiment of the present disclosure, four first connection lines 181 connected to one pixel PX are required, and four second connection lines 182 connected to one pixel PX are required.

Specifically, each of the four first connection lines 181 includes a scan signal line that transmits a scan signal SCAN, an emission signal line that transmits an emission signal EM, a low potential voltage line that transmits a low potential voltage VSS, and a high potential voltage line that transmits a high potential voltage VDD. In addition, each of the four second connection lines 182 includes a red data line that transmits a red data voltage Data_R, a green data line that transmits a green data voltage Data_G, a blue data line that transmits a blue data voltage Data_B, and an initialization voltage line that transmits an initialization voltage Vini.

In the display device according to another example embodiment of the present disclosure, a stretching rate (or a stretching length ratio) based on the first connection line 181 extending in the first direction X is as follows. A length of the first connection line 181 in the first direction X before the first connection line 181 is stretched on the basis of 100 ppi (pixel per inch) is 127 μm, and a length in the first direction X of the first connection line 181 that is fully stretched is 240 μm. Accordingly, in the display device according to another example embodiment of the present disclosure, a stretching rate (or a stretching length ratio) based on the first connection line 181 extending in the first direction X is 1.9 (=240 μm/127 μm).

As a result, in the display device according to another example embodiment of the present disclosure, it can be seen that the stretching rate of the display device is improved by 35% or more by configuring the pixel circuit to integrate the scan signal lines.

Hereinafter, a display device according to still another example embodiment of the present disclosure will be described. An example embodiment of the present disclosure and still another example embodiment of the present disclosure have differences only in terms of a connection relationship of a storage capacitor. Therefore, descriptions of overlapping parts of an example embodiment of the present disclosure and still another example embodiment of the present disclosure may be omitted, and the differences between an example embodiment of the present disclosure and still another example embodiment of the present disclosure may be mainly described.

Figure 14A:
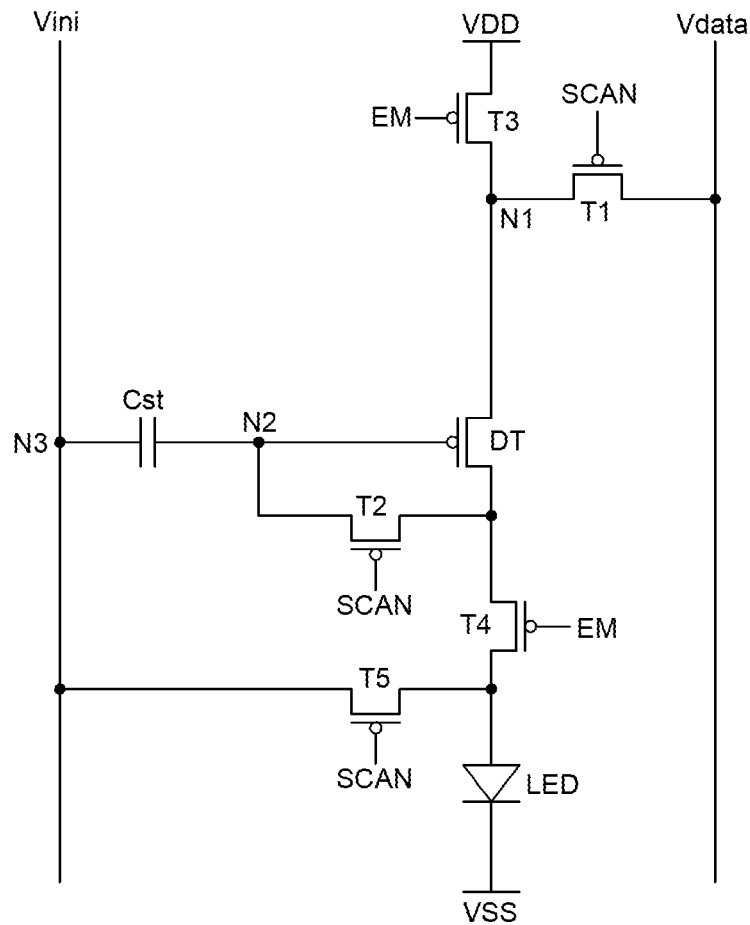
FIGS. 14A and 14B are circuit diagrams of sub-pixels of a display device according to still another example embodiment of the present disclosure.
Figure 14B:
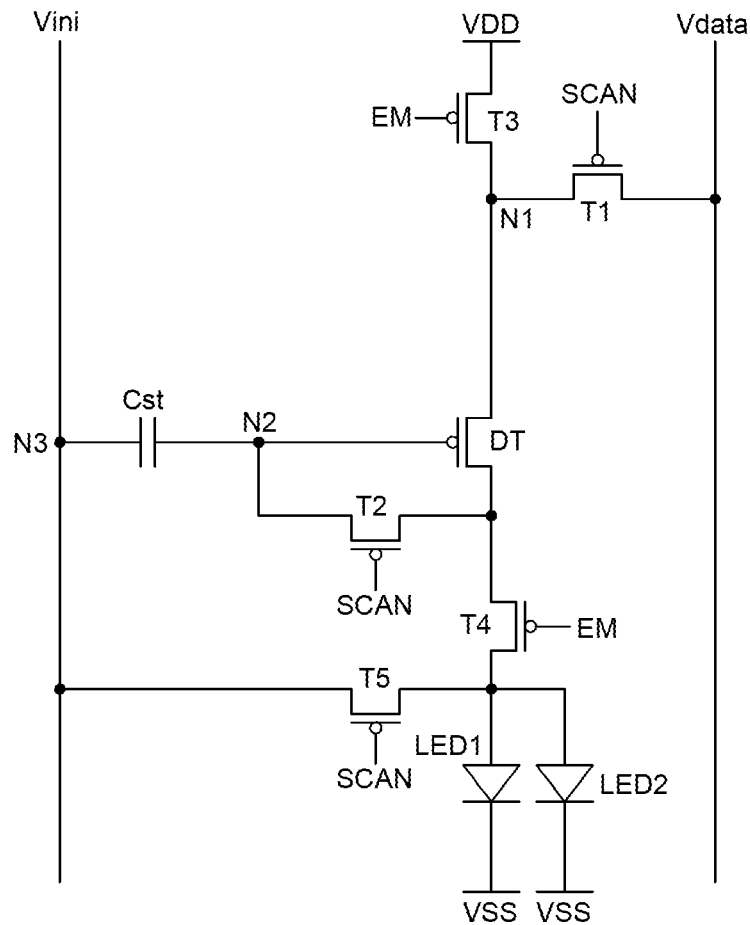

FIGS. 14A and 14B are circuit diagrams of sub-pixels of a display device according to still another example embodiment of the present disclosure.

Specifically, FIG. 14A illustrates a case in which a sub-pixel of the display device according to still another example embodiment of the present disclosure includes one light emitting element LED. And, FIG. 14B illustrates a case in which a sub-pixel of the display device according to still another example embodiment of the present disclosure includes two light emitting elements LED1 and LED2.

For reference, the switching transistor 150 shown in FIG. 3 may correspond to a first transistor T1 of FIGS. 14A and 14B, the driving transistor 160 shown in FIG. 3 may correspond to a driving transistor DT of FIGS. 14A and 14B, and the LED 170 shown in FIG. 3 may correspond to a light emitting element LED of FIGS. 14A and 14B.

As shown in FIG. 14B, two light emitting elements LED1 and LED2 may be connected in parallel in one sub-pixel of the display device according to still another example embodiment of the present disclosure. That is, respective anodes of the two light emitting elements LED1 and LED2 may be connected to each other, and respective cathodes of the two light emitting elements LED1 and LED2 may be connected to low potential voltage VSS lines.

Accordingly, when one LED1 of the two light emitting elements LED1 and LED2 does not emit light due to transfer defects, the other one LED2 of the two LEDs LED1 and LED2 can emit light normally. That is, the other one of the two light emitting elements LED1 and LED2 may perform a function of a redundancy LED. As a result, the display device according to still another example embodiment of the present disclosure includes a redundancy LED, so that a yield of the display device may be improved.

Hereinafter, a configuration and a driving method of the sub-pixel will be described in detail with reference to FIG. 14A.

In the display device according to still another example embodiment of the present disclosure, each of the sub-pixels includes a light emitting element LED, a driving transistor DT, a first transistor T1 to a fifth transistor T5, and a storage capacitor Cst.

The light emitting element LED emits light by a driving current supplied from the driving transistor DT. An anode electrode of the light emitting element LED is connected to a fourth transistor T4 and the fifth transistor T5, and a cathode electrode of the light emitting element LED is connected to an input terminal of a low potential voltage VSS.

The driving transistor DT controls a driving current applied to the light emitting element LED according to its gate-source voltage Vgs. In addition, a source electrode of the driving transistor DT is connected to a first node N1, a gate electrode of the driving transistor DT is connected to a second node N2, and a drain electrode of the driving transistor DT is connected to a second transistor T2 and the fourth transistor T4.

The first transistor T1 applies a data voltage Vdata supplied from the data line to the first node N1 that is the source electrode of the driving transistor DT. The first transistor T1 includes a source electrode connected to the data line, a drain electrode connected to the first node N1, and a gate electrode connected to a scan signal line that transmits a scan signal SCAN. Accordingly, the first transistor T1 applies the data voltage Vdata supplied from the data line to the first node N1 that is the source electrode of the driving transistor DT in response to the scan signal SCAN at a low level, which is a turn-on level.

The second transistor T2 diode-connects the gate electrode and the drain electrode of the driving transistor DT. The second transistor T2 includes a source electrode connected to the drain electrode of the driving transistor DT, a drain electrode connected to the second node N2 that is the gate electrode of the driving transistor DT, and a gate electrode connected to the scan signal line that transmits the scan signal SCAN. Accordingly, the second transistor T2 diode-connects the gate electrode and the drain electrode of the driving transistor DT in response to the scan signal SCAN at a low level, which is a turn-on level.

The third transistor T3 applies a high potential voltage VDD to the first node N1 that is the source electrode of the driving transistor DT. The third transistor T3 includes a source electrode connected to a high potential voltage line that transmits the high potential voltage VDD, a drain electrode connected to the first node N1, and a gate electrode connected to an emission signal line that transmits an emission signal EM. Accordingly, the third transistor T3 applies the high potential voltage VDD to the first node N1 that is the source electrode of the driving transistor DT in response to the emission signal EM at a low level, which is a turn-on level.

The fourth transistor T4 forms a current path between the driving transistor DT and the light emitting element LED. The fourth transistor T4 includes a source electrode connected to the drain electrode of the driving transistor DT, a drain electrode connected to the light emitting element LED, and a gate electrode connected to the emission signal line that transmits the emission signal EM. Accordingly, the fourth transistor T4 forms a current path between the light emitting element LED and the drain electrode of the driving transistor DT in response to the emission signal EM.

The fifth transistor T5 applies an initialization voltage Vini to the anode electrode of the light emitting element LED. The fifth transistor T5 includes a source electrode connected to a third node N3 that is connected to an initialization voltage line that transmits the initialization voltage Vini, a drain electrode connected to the anode electrode of the light emitting element LED, and a gate electrode connected to the scan signal line that transmits the scan signal SCAN. Accordingly, the fifth transistor T5 applies the initialization voltage Vini to the anode electrode of the light emitting element LED in response to the scan signal SCAN at a low level, which is a turn-on level.

The storage capacitor Cst includes a first electrode connected to the second node N2 and a second electrode connected to the third node N3. That is, one electrode of the storage capacitor Cst is connected to the gate electrode of the driving transistor DT, and the other electrode of the storage capacitor Cst is connected to the initialization voltage line that transmits the initialization voltage Vini.

Figure 15:
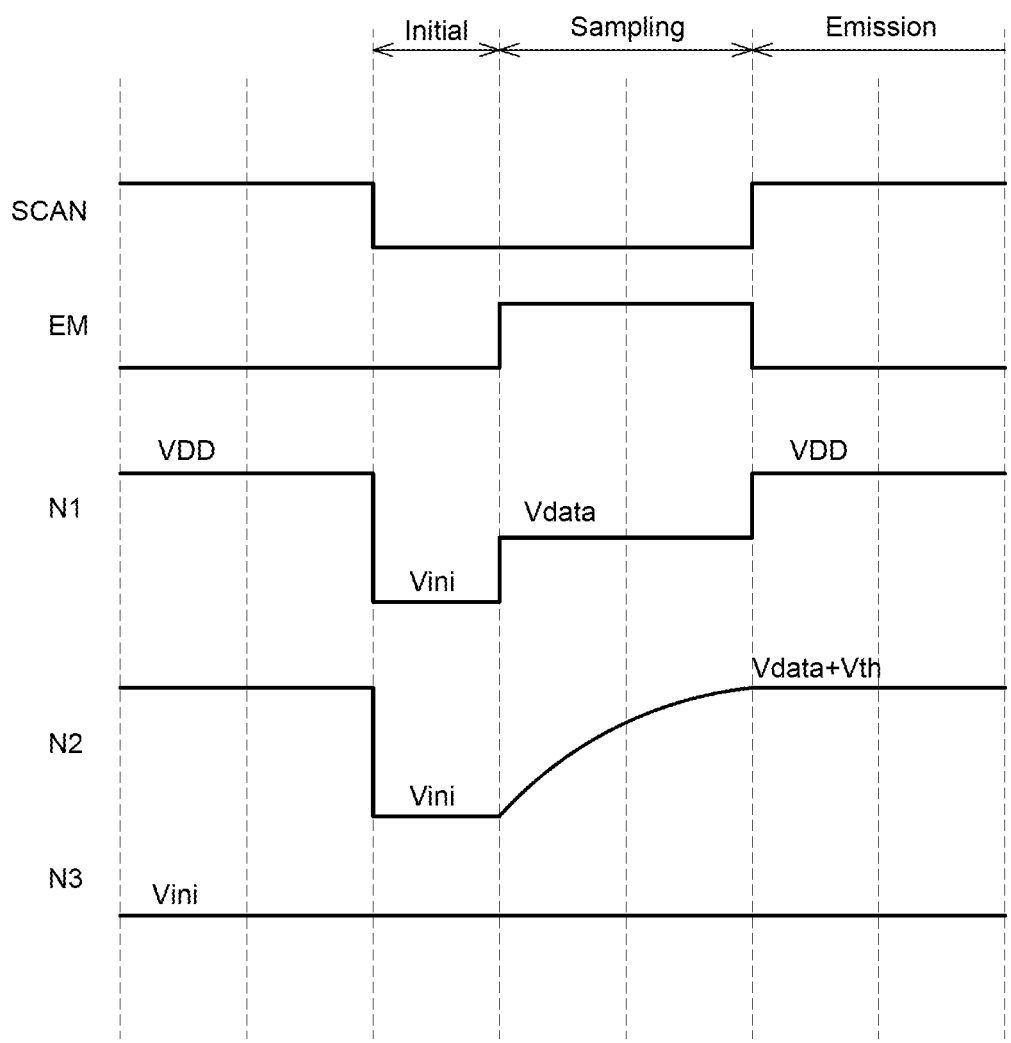
FIG. 15 is a waveform diagram illustrating an emission signal and a scan signal of the display device according to still another example embodiment of the present disclosure.

FIG. 15 is a waveform diagram illustrating an emission signal and a scan signal of the display device according to still another example embodiment of the present disclosure.

Figure 16A:
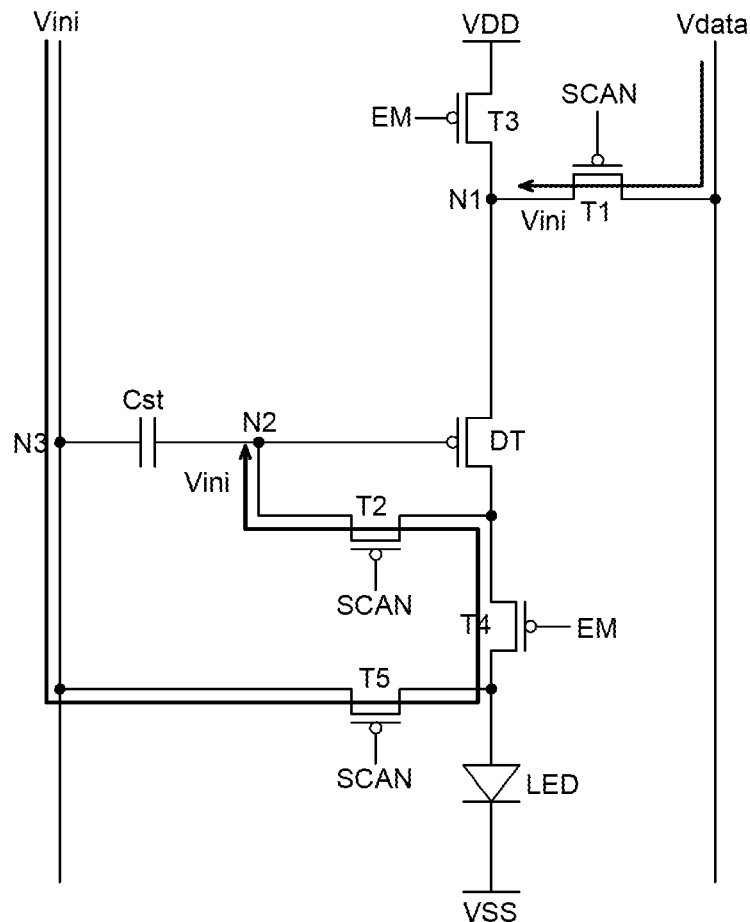
FIG. 16A is a circuit diagram of a pixel of the display device according to still another example embodiment of the present disclosure during an initial period.

FIG. 16A is a circuit diagram of a pixel of the display device according to still another example embodiment of the present disclosure during an initial period.

Figure 16B:
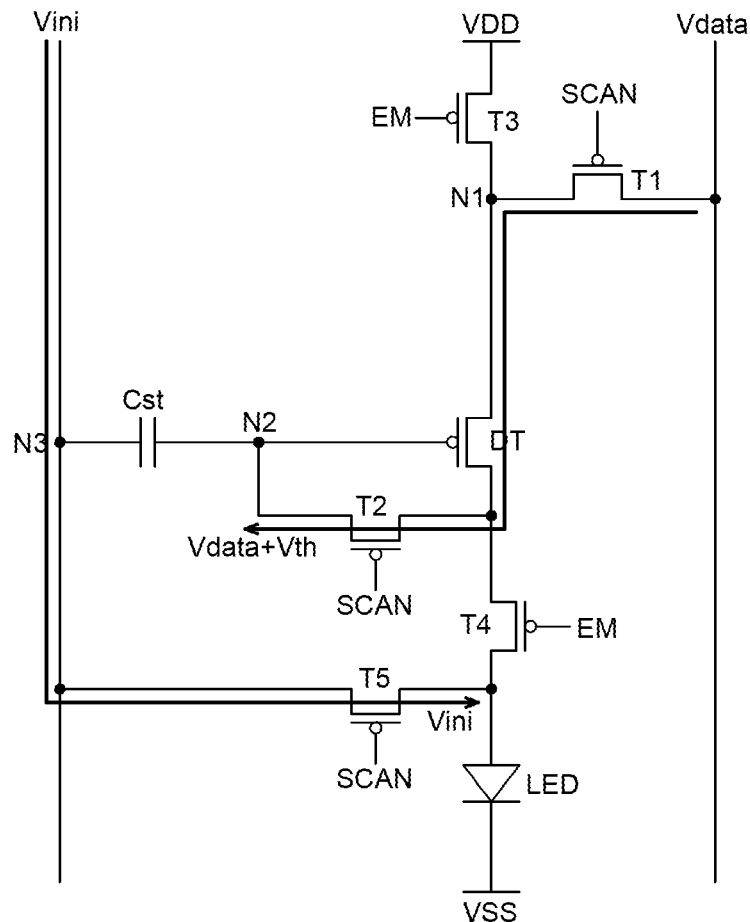
FIG. 16B is a circuit diagram of a pixel of the display device according to still another example embodiment of the present disclosure during a sampling period.

FIG. 16B is a circuit diagram of a pixel of the display device according to still another example embodiment of the present disclosure during a sampling period.

Figure 16C:
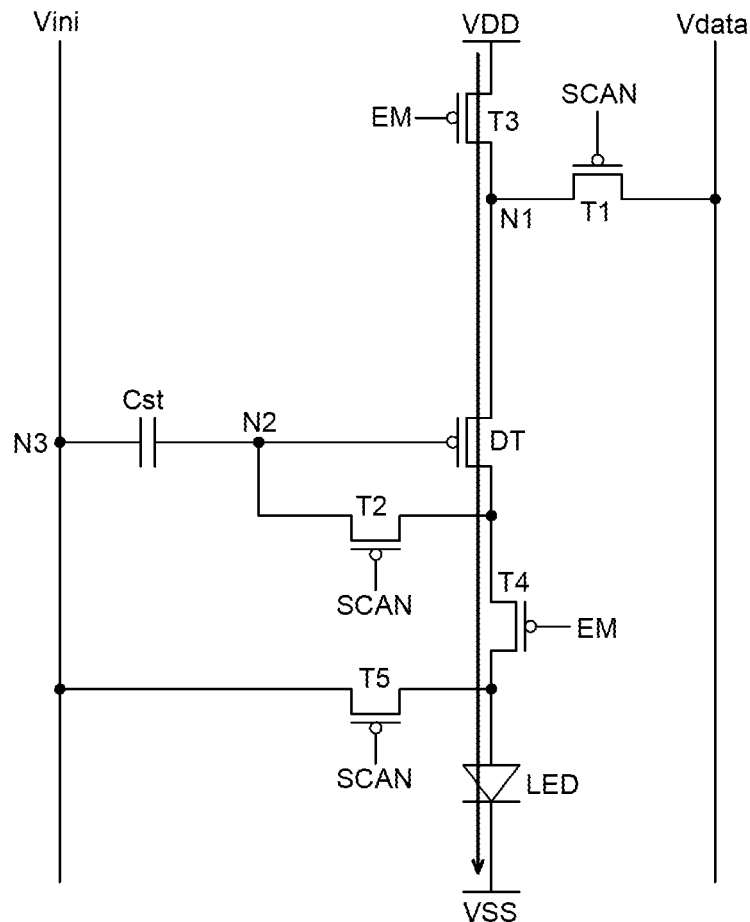
FIG. 16C is a circuit diagram of a pixel of the display device according to still another example embodiment of the present disclosure during an emission period.

FIG. 16C is a circuit diagram of a pixel of the display device according to still another example embodiment of the present disclosure during an emission period.

A driving of the display device according to still another example embodiment of the present disclosure will be described with reference to FIGS. 15 to 16C.

And, referring to FIGS. 15 and 16A, during an initial period Initial, the scan signal SCAN is a low level, which is a turn-on level, and the emission signal EM is a low level, which is a turn-on level. Accordingly, the second transistor T2, the fourth transistor T4, and the fifth transistor T5 are turned on to apply the initialization voltage Vini to the second node N2. As a result, the gate electrode of the driving transistor DT is initialized to the initialization voltage Vini. The initialization voltage Vini may be selected within a voltage range that is sufficiently lower than an operating voltage of the light emitting element LED, and may be set to a voltage that is equal to or lower than the low potential voltage VSS.

In addition, in the initial period Initial, the first transistor T1 is turned on, and the data voltage Vdata may be equal to the initialization voltage Vini. Accordingly, the initialization voltage Vini is applied to the first node N1. And, in the initial period Initial, the initialization voltage Vini is maintained at the third node N3.

And, referring to FIGS. 15 and 16B, during a sampling period Sampling, the scan signal SCAN is a low level, which is a turn-on level, and the emission signal EM is a high level, which is a turn-off level. And, during the sampling period Sampling, the first transistor T1 is turned on, so that the data voltage Vdata is applied to the first node N1. In addition, as the second transistor T2 is also turned on, the driving transistor DT is diode-connected and the gate electrode and the drain electrode of the driving transistor DT are short-circuited, so that the driving transistor DT operates like a diode.

In the sampling period Sampling, a current flows between the source and the drain of the driving transistor DT. Since the gate electrode and the drain electrode of the driving transistor DT are in a diode-connected state, a voltage of the second node N2 increases by the current flowing from the source electrode to the drain electrode until the gate-source voltage Vgs of the driving transistor DT becomes Vth. During the sampling period Sampling, the voltage of the second node N2 is charged to a voltage Vdata+Vth corresponding to the sum of the data voltage Vdata and a threshold voltage Vth of the driving transistor DT.

Meanwhile, in the sampling period Sampling, the fifth transistor T5 is turned on to apply the initialization voltage Vini to the anode electrode of the light emitting element LED. Also, in the sampling period Sampling, the initialization voltage Vini is maintained at the third node N3.

And, referring to FIGS. 15 and 16C, during an emission period, the scan signal SCAN is a high level, which is a turn-off level, and the emission signal EM is a low level, which is a turn-on level. Accordingly, the third transistor T3 is turned on to apply the high potential voltage VDD to the first node N1. In addition, the fourth transistor T4 is also turned on to form a current path between the driving transistor DT and the light emitting element LED. As a result, a driving current that passes through the source electrode and the drain electrode of the driving transistor DT is applied to the light emitting element LED.

That is, the voltage of the second node N2 that is the gate electrode of the driving transistor DT is the voltage Vdata+Vth corresponding to the sum of the data voltage Vdata and the threshold voltage Vth of the driving transistor DT, and a voltage of the first node N1 that is the source electrode of the driving transistor DT is the high potential voltage VDD. Accordingly, the gate-source voltage Vgs of the driving transistor DT may be Vdata+Vth−VDD.

During the emission period Emission, a relational expression with respect to a driving current flowing through the light emitting element LED is as in the following Equation 1.

$$Iled = k*(Vgs-Vth)^2 = k*(Vdata+Vth-VDD-Vth)^2 = k*(Vdata-VDD)^2 \quad \text{Equation 1}$$

In Equation 1, k represents a proportional constant determined by electron mobility, parasitic capacitance, and channel capacitance of the driving transistor DT.

As shown in Equation 1, a threshold voltage Vth component of the driving transistor DT is erased in the relational expression of the driving current Iled. This means that in the display device according to the present disclosure, even if the threshold voltage Vth changes, the driving current Iled does not change. That is, the display device according to still another example embodiment of the present disclosure can program the data voltage regardless of the amount of change in the threshold voltage Vth.

In addition, in the display device according to still another example embodiment of the present disclosure, the initialization voltage Vini, which is a constant power voltage, is applied to the storage capacitor Cst. Due to this, the storage capacitor Cst may be stabilized, so that the pixel circuit may be normally driven even if a size of the storage capacitor Cst is designed to be small. Accordingly, an area occupied by the storage capacitor Cst in one sub-pixel is reduced, so that a redundancy LED can be disposed in the sub-pixel as shown in FIG. 9B. As a result, due to the circuit structure described above, the yield of the display device according to an example embodiment of the present disclosure may be improved.

In addition, the display device according to still another example embodiment of the present disclosure may allow for a reduction in the number of scan lines compared to the display device according to an example embodiment of the present disclosure. Accordingly, it is possible to reduce the number of stretched lines in the display device according to still another example embodiment of the present disclosure. Accordingly, due to the reduction in the number of stretching lines, a stretching ratio and stretching reliability may be improved.

The example embodiments of the present disclosure can also be described as follows:

A display device according to an example embodiment of the present disclosure may include a stretchable lower substrate; a pattern layer disposed on the lower substrate and including a plurality of plate patterns and a plurality of line patterns; a plurality of pixels disposed on each of the plurality of plate patterns; and a plurality of connection lines disposed on each of the plurality of line patterns to connect the plurality of pixels, wherein each of pixel circuits formed in the plurality of pixels includes at least one light emitting element, a driving transistor, a storage capacitor, and a first transistor to a fifth transistor, and a constant power voltage may be applied to the storage capacitor. The phrase "first transistor to a fifth transistor" includes a first, second, third, fourth and fifth transistor within the meaning of that phrase. Similarly, the phrase "first transistor to N transistor" includes N number of transistors within the meaning of the term.

The at least one light emitting element may include a first light emitting element and a second light emitting element that are connected in parallel.

The driving transistor may include a source electrode connected to a first node, a drain electrode connected to the second transistor and the fourth transistor, and a gate electrode connected to a second node, the first transistor may include a source electrode connected to one of a plurality of data lines, a drain electrode connected to the first node, and a gate electrode connected to a scan signal line, the second transistor may include a source electrode connected to the drain electrode of the driving transistor, a drain electrode connected to the second node, and a gate electrode connected to the scan signal line, the third transistor may include a source electrode connected to a high potential voltage line, a drain electrode connected to the first node, and a gate electrode connected to an emission signal line, the fourth transistor may include a source electrode connected to the drain electrode of the driving transistor, a drain electrode connected to the at least one light emitting element, and a gate electrode connected to the emission signal line, the fifth transistor may include a source electrode connected to an initialization voltage line, a drain electrode connected to the at least one light emitting element, and a gate electrode connected to the scan signal line.

One electrode of the storage capacitor may be connected to the second node, and the other electrode of the storage capacitor may be connected to the initialization voltage line.

One electrode of the storage capacitor may be connected to the second node, and the other electrode of the storage capacitor may be connected to the high potential voltage line.

The plurality of connection lines may include a plurality of first connection lines extending in a first direction; and a plurality of second connection lines extending in a second direction.

The plurality of first connection lines may include the high potential voltage line, a low potential voltage line, the emission signal line, and the scan signal line, the plurality of second connection lines include the plurality of data lines and the initialization voltage line.

The number of the plurality of first connection lines may be the same as the number of the plurality of second connection lines.

Each of a plurality of the pixel circuits may include, an initial period in which an initialization voltage may be applied to the first node and the second node; a sampling period in which a voltage of the second node may be charged to a voltage corresponding to a sum of a data voltage and a threshold voltage of the driving transistor; and an emission period in which the at least one light emitting element emits light.

A display device according to another example embodiment of the present disclosure may include a plurality of pixels that are spaced apart from each other and a plurality of connection lines that connect the plurality of pixels and is capable of being stretched, each of pixel circuits formed in the plurality of pixels may include at least one light emitting element, a driving transistor, a storage capacitor, and a first transistor to a fifth transistor, and one of a scan signal and an emission signal may be applied to a gate electrode of each of the first transistor to the fifth transistor.

The at least one light emitting element may include a first light emitting element and a second light emitting element that are connected in parallel.

The driving transistor may include a source electrode connected to a first node, a drain electrode connected to the second transistor and the fourth transistor, and a gate electrode connected to a second node, The first transistor may include a source electrode connected to one of a plurality of data lines, a drain electrode connected to the first node, and a gate electrode connected to a scan signal line, the second transistor may include a source electrode connected to the drain electrode of the driving transistor, a drain electrode connected to the second node, and a gate electrode connected to the scan signal line; the third transistor may include a source electrode connected to a high potential voltage line, a drain electrode connected to the first node, and a gate electrode connected to an emission signal line, the fourth transistor may include a source electrode connected to the drain electrode of the driving transistor, a drain electrode connected to the at least one light emitting element, and a gate electrode connected to the emission signal line, the fifth transistor may include a source electrode connected to an initialization voltage line, a drain electrode connected to the at least one light emitting element, and a gate electrode connected to the scan signal line.

The storage capacitor may be connected to the initialization voltage line through which a fixed initialization voltage may be applied.

The storage capacitor may be connected to the high potential voltage line through which a fixed high potential voltage may be applied.

The plurality of connection lines may include a plurality of first connection lines extending in a first direction; and a plurality of second connection lines extending in a second direction.

The plurality of first connection lines may include the high potential voltage line, a low potential voltage line, the emission signal line, and the scan signal line, the plurality of second connection lines include the plurality of data lines and the initialization voltage line.

The number of the plurality of first connection lines may be the same as the number of the plurality of second connection lines.

Each of a plurality of the pixel circuits may be driven in, an initial period in which the scan signal may be a turn-on level and the emission signal may be a turn-on level; a sampling period in which the scan signal may be a turn-on level, and the light emitting signal may be a turn-off level; and an emission period in which the scan signal may be a turn-off level, and the light emitting signal may be a turn-on level, during the sampling period, a voltage of the second node may be charged to a voltage Vdata+Vth corresponding to a sum of a data voltage and a threshold voltage of the driving transistor.

Although the example embodiments of the present disclosure have been described in detail with reference to the accompanying drawings, the present disclosure is not limited thereto and may be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
a stretchable lower substrate;
a pattern layer disposed on the stretchable lower substrate and including:
a plurality of plate patterns; and
a plurality of line patterns, each of the plurality of line patterns extending from one of the plurality of plate patterns to another of the plurality of plate patterns;
a plurality of pixels each respectively disposed on each of the plurality of plate patterns, at least one pixel on each plate pattern, each of the plurality of pixels including:
a driving transistor on the plate pattern, the driving transistor including a gate electrode;
a storage capacitor on the plate pattern, the storage capacitor including an intermediate metal layer that overlaps the gate electrode, the intermediate metal layer acting as a first electrode of the storage capacitor and the gate electrode of the driving transistor acting as a second electrode of the storage capacitor;
an interlayer insulating layer positioned between the intermediate metal layer and the gate electrode of the driving transistor, the interlayer insulating layer acting as a dielectric for the storage capacitor;
a planarization layer, the planarization layer extending from one of the plurality of line patterns to another of the plurality of line patterns; and
a plurality of connection lines disposed on each of the plurality of line patterns to connect the plurality of pixels, the plurality of connection lines being in contact with an upper surface of the planarization layer, a sidewall of the planarization layer and an upper surface of the pattern layer,
wherein each pixel of the plurality of pixels includes at least one light emitting element, the driving transistor, the storage capacitor, a first transistor, a second transistor, a third transistor, a fourth transistor and a fifth transistor, each of which are positioned on a respective single plate pattern of the plurality of plate patterns,
wherein a constant power voltage is applied to the storage capacitor,
wherein the first electrode of the storage capacitor is directly connected to an initialization voltage line, and the second electrode of the storage capacitor is connected to the gate electrode of the driving transistor.

2. The display device of claim 1,
wherein the at least one light emitting element includes a first light emitting element and a second light emitting element that are connected in parallel.

3. The display device of claim 1,
wherein the driving transistor includes a source electrode connected to a first node, a drain electrode connected to the second transistor and the fourth transistor, and a gate electrode connected to a second node,
wherein the first transistor includes a source electrode connected to one of a plurality of data lines, a drain electrode connected to the first node, and a gate electrode connected to a scan signal line,
wherein the second transistor includes a source electrode connected to the drain electrode of the driving transistor, a drain electrode connected to the second node, and a gate electrode connected to the scan signal line,
wherein a third transistor includes a source electrode connected to a high potential voltage line, a drain electrode connected to the first node, and a gate electrode connected to an emission signal line,
wherein the fourth transistor includes a source electrode connected to the drain electrode of the driving transistor, a drain electrode connected to the light emitting element, and a gate electrode connected to the emission signal line,
wherein the fifth transistor includes a source electrode connected to the initialization voltage line, a drain electrode connected to the light emitting element, and a gate electrode connected to the scan signal line.

4. The display device of claim 3,
wherein the plurality of connection lines includes a plurality of first connection lines extending in a first direction and a plurality of second connection lines extending in a second direction.

5. The display device of claim 4,
wherein the plurality of first connection lines includes the high potential voltage line, a low potential voltage line, the emission signal line, and the scan signal line,
wherein the plurality of second connection lines includes the plurality of data lines and the initialization voltage line.

6. The display device of claim 4,
wherein the number of the plurality of first connection lines is the same as the number of the plurality of second connection lines.

7. The display device of claim 3,
wherein each of a plurality of the pixel circuits includes,
an initial period in which an initialization voltage is applied to the first node and the second node;
a sampling period in which a voltage of the second node is charged to a voltage corresponding to a sum of a data voltage and a threshold voltage of the driving transistor; and
an emission period in which the at least one light emitting element emits light.

8. The display device of claim 1, further comprising:
a plurality of driving transistors on and overlapping the plurality of plate patterns; and
a buffer layer between the plurality of driving transistors and the plurality of plate patterns.

9. A display device, comprising:
a substrate that is stretchable;
a plurality of pixels on the substrate, each of the plurality of pixels being spaced apart from each other, each of the plurality of pixels including:
a buffer layer on the substrate;
at least one insulating layer on the buffer layer;
a passivation layer on the at least one insulating layer;
a planarization layer that is in contact with sidewalls of the buffer layer, the at least one insulating layer and the passivation layer and with the substrate;
a driving transistor including a gate electrode;
a storage capacitor including an intermediate metal layer that overlaps the gate electrode, the intermediate metal layer acting as a first electrode of the storage capacitor and the gate electrode of the driving transistor acting as a second electrode of the storage capacitor; and
a first insulating layer of the at least one insulating layer positioned between the intermediate metal layer and the gate electrode, the interlayer insulating layer acting as a dielectric for the storage capacitor;
a plurality of connection lines on the substrate, the plurality of connection lines connecting the plurality of pixels and being capable of being stretched, the plurality of connection lines being in contact with an upper surface of the planarization layer, a sidewall of the planarization layer and the substrate;
wherein each of pixel circuits formed in the plurality of pixels includes at least one light emitting element, the driving transistor, the storage capacitor, a first transistor, a second transistor, a third transistor, a fourth transistor and a fifth transistor,
wherein one of a scan signal and an emission signal is applied to a gate electrode of each of the first transistor, the second transistor, the third transistor, the fourth transistor and the fifth transistor,
wherein the first electrode of the storage capacitor is directly connected to an initialization voltage line, and the second electrode of the storage capacitor is connected to the gate electrode of the driving transistor.

10. The display device of claim 9,
wherein the at least one light emitting element includes a first light emitting element and a second light emitting element that are connected in parallel.

11. The display device of claim 9,
wherein the driving transistor includes a source electrode connected to a first node, a drain electrode connected to the second transistor and the fourth transistor, and a gate electrode connected to a second node,
wherein the first transistor includes a source electrode connected to one of a plurality of data lines, a drain electrode connected to the first node, and a gate electrode connected to a scan signal line,
wherein the second transistor includes a source electrode connected to the drain electrode of the driving transistor, a drain electrode connected to the second node, and a gate electrode connected to the scan signal line;
wherein the third transistor includes a source electrode connected to a high potential voltage line, a drain electrode connected to the first node, and a gate electrode connected to an emission signal line,
wherein the fourth transistor includes a source electrode connected to the drain electrode of the driving transistor, a drain electrode connected to the at least one light emitting element, and a gate electrode connected to the emission signal line,
wherein the fifth transistor includes a source electrode connected to the initialization voltage line, a drain electrode connected to the at least one light emitting element, and a gate electrode connected to the scan signal line.

12. The display device of claim 11,
wherein the plurality of connection lines includes,
a plurality of first connection lines extending in a first direction; and
a plurality of second connection lines extending in a second direction.

13. The display device of claim 12,
wherein the plurality of first connection lines includes the high potential voltage line, a low potential voltage line, the emission signal line, and the scan signal line,
wherein the plurality of second connection lines includes the plurality of data lines and the initialization voltage line.

14. The display device of claim 12,
wherein the number of the plurality of first connection lines is the same as the number of the plurality of second connection lines.

15. The display device of claim 11,
wherein each of a plurality of the pixel circuits is driven in:
an initial period in which the scan signal is a turn-on level and the emission signal is a turn-on level;
a sampling period in which the scan signal is a turn-on level, and the light emitting signal is a turn-off level; and
an emission period in which the scan signal is a turn-off level, and the light emitting signal is a turn-on level,
wherein during the sampling period, a voltage of the second node is charged to a voltage Vdata+Vth corresponding to a sum of a data voltage and a threshold voltage of the driving transistor.

16. A display device, comprising:
a stretchable substrate;
a pattern layer on the stretchable substrate, the pattern layer including:
a first island pattern;
a second island pattern; and
at least two line patterns that extend in parallel from the first island pattern to the second island pattern;

a first pixel on the first island pattern, the first pixel including:
a light emitting element;
a driving transistor on the first island pattern, the driving transistor including a first gate electrode;
a switching transistor on the first island pattern and adjacent to the driving transistor, the switching transistor including a second gate electrode;
a planarization layer that is on and overlaps the first island pattern, the planarization layer being between the first island pattern and the light emitting element;
an insulating layer on the driving transistor and the switching transistor; and
a storage capacitor on the first island pattern, the storage capacitor including an intermediate metal layer separated from the driving transistor and the switching transistor by the insulating layer, the intermediate metal layer acting as a first electrode of the storage capacitor and the first gate electrode or the second gate electrode acting as a second electrode of the storage capacitor, the insulating layer acting as a dielectric for the storage capacitor;
a second pixel on the second island pattern;
a first connection line that is on an upper surface and a sidewall of the planarization layer and is on a first of the at least two line patterns; and
a second connection line that is on the upper surface and the sidewall of the planarization layer and is on a second of the at least two line patterns,
wherein the intermediate metal layer overlaps the first gate electrode of the driving transistor,
wherein the first electrode of the storage capacitor is directly connected to an initialization voltage line, and the second electrode of the storage capacitor is connected to the first gate electrode or the second gate electrode.

* * * * *